(12) United States Patent
Petkie et al.

(10) Patent No.: US 12,538,705 B2
(45) Date of Patent: Jan. 27, 2026

(54) THERMAL LENSING ELECTRODE IN THERMOELECTRIC GENERATORS FOR IMPROVED PERFORMANCE

(71) Applicant: ATS IP, LLC, Fort Collins, CO (US)

(72) Inventors: Ronald Petkie, Fort Collins, CO (US); John B. Newman, Fort Collins, CO (US); Ion M. Basa, Fort Collins, CO (US)

(73) Assignee: Advanced Thermovoltaic Systems, Corp., Loveland, CO (US)

( * ) Notice: Subject to any disclaimer, the term of this patent is extended or adjusted under 35 U.S.C. 154(b) by 175 days.

(21) Appl. No.: 18/151,296

(22) Filed: Jan. 6, 2023

(65) Prior Publication Data

US 2023/0144491 A1 May 11, 2023

Related U.S. Application Data

(63) Continuation of application No. 16/969,524, filed as application No. PCT/US2019/061894 on Nov. 16, 2019, now Pat. No. 11,552,235.

(Continued)

(51) Int. Cl.
*H10N 10/17* (2023.01)
*C25D 3/12* (2006.01)
(Continued)

(52) U.S. Cl.
CPC .............. *H10N 10/17* (2023.02); *C25D 3/12* (2013.01); *C25D 7/123* (2013.01); *H10N 10/01* (2023.02); *H10N 10/817* (2023.02); *H10N 10/82* (2023.02)

(58) Field of Classification Search
CPC ...... H10N 10/17; H10N 10/01; H10N 10/817; H10N 10/82; C25D 3/12; C25D 7/123
See application file for complete search history.

(56) References Cited

U.S. PATENT DOCUMENTS 3,547,706 A    12/1970   McGrew
4,320,251 A *   3/1982   Narasimhan .... H01L 31/022425
                                                            438/606

(Continued)

FOREIGN PATENT DOCUMENTS

JP     1997 9293906     11/1997
JP     H09293906 A     11/1997
(Continued)

OTHER PUBLICATIONS

JP-2006294935-A, Machine Translation, Inaizumi (Year: 2006).*
(Continued)

*Primary Examiner* — Devina Pillay
(74) *Attorney, Agent, or Firm* — FisherBroyles, LLP; Cara L. Crowley-Weber; Gregory T. Fettig

(57) ABSTRACT

Exemplary thermoelectric devices and methods are disclosed herein. Thermoelectric generator performance is increased by the shaping isothermal fields within the bulk of a thermoelectric pellet, resulting in an increase in power output of a thermoelectric generator module. In one embodiment, a thermoelectric device includes a pellet comprising a semiconductor material, a first metal layer surrounding a first portion of the pellet, and a second metal layer surrounding a second portion of the pellet. The first and second metal layers are configured proximate to one another about a perimeter of the pellet. The pellet is exposed at the perimeter. And the perimeter is configured at a sidewall height about the pellet to provide a non-linear effect on a power output of the thermoelectric device by modifying an isotherm surface curvature within the pellet. The device also includes a metal container thermally and electrically bonded to the pellet.

13 Claims, 25 Drawing Sheets

Related U.S. Application Data

(60) Provisional application No. 62/768,679, filed on Nov. 16, 2018.

(51) Int. Cl.
*C25D 7/12* (2006.01)
*H10N 10/01* (2023.01)
*H10N 10/817* (2023.01)
*H10N 10/82* (2023.01)

(56) References Cited

U.S. PATENT DOCUMENTS

| | | |
|---|---|---|
| 4,492,809 A | 1/1985 | Dahlberg |
| 4,654,224 A | 3/1987 | Allred |
| 5,430,322 A | 7/1995 | Koyanagi |
| 5,441,546 A * | 8/1995 | Moard .................. F23L 7/002 |
| | | 48/102 A |
| 5,441,576 A | 8/1995 | Bierschenk et al. |
| 6,274,803 B1 | 8/2001 | Yoshioka |
| 2006/0005873 A1 | 1/2006 | Kambe |
| 2006/0048809 A1 | 3/2006 | Onvural |
| 2006/0123799 A1* | 6/2006 | Tateyama .............. H10N 10/01 |
| | | 136/204 |
| 2007/0107764 A1 | 5/2007 | Kanatzidis |
| 2008/0023057 A1 | 1/2008 | Nakajima et al. |
| 2011/0304004 A1 | 12/2011 | Park |
| 2012/0097206 A1 | 4/2012 | Sadaoka |
| 2015/0132473 A1 | 5/2015 | Petkie |
| 2016/0163950 A1 | 6/2016 | Liao et al. |
| 2018/0204995 A1 | 7/2018 | Gruenwald et al. |
| 2018/0358529 A1* | 12/2018 | Sottong .................. H10N 10/13 |

FOREIGN PATENT DOCUMENTS

| | | |
|---|---|---|
| JP | 2000349352 | 12/2000 |
| JP | 2006294935 | 10/2006 |
| JP | 2006294935 A * | 10/2006 |
| JP | 2008010612 A * | 1/2008 |
| JP | 2013 26567 | 2/2013 |
| JP | 2013026567 A | 2/2013 |
| JP | 2010278035 | 7/2013 |
| KR | 1020100090209 | 8/2010 |
| KR | 20160077633 A | 7/2016 |
| KR | 20170004464 | 1/2017 |
| WO | WO 2011014479 | 2/2011 |

OTHER PUBLICATIONS

Lin, Journal of Electronic Materials, vol. 41, No. 1, 2012, pp. 153-158 (Year: 2012).*

Fujimoto, JP2008010612A (Year: 2008).*

Chinese Search Report from Chinese Patent Application No. 201980088078.4 dated May 24, 2024.

Anatychak et al. (2006) Thermoelectric Phenomena Under Large Thermal Gradients, CRC Handbook of Thermoelectric: Micro to Nano pp. 3.1-3.11.

Anatychak et al. (2011) "Inverse Problems of Thermoelectricity" J. Electronic Materials 40(5):856-861.

Brito et al. (2016) J. Electronic Materials 45(3):1711-1729.

Marin (2010) "Characteristic Dimensions for Heat Transfer" Lat. Am. Phys. Educ. 4(1):56-60.

Min (2006) CRC Handbook of Thermoelectric: Micro to Nano, ed. D.M. Rowe (Boca Raton: CRC Press), p. 11.1-11.15.

Rowe (1992) "Optimization of Thermoelectric Module Geometry for 'Waste Heat' Electric Power Station" J. Power Sources 38:253-259.

Rowe et al. (1996) "Design Theory of Thermoelectric Modules for Electrical Power Generation, IEE" Proc.-Sci. Meas. Technol. 143(6):353-356.

Young (2018) "Modelling the Thermoelectric Effect" Comsol on-line webinar available at https://www.brighttalk.com/webcast/8013/300805/modelling-the-thermoelectric-effect.

* cited by examiner

THERMAL LENSING ELECTRODE IN THERMOELECTRIC GENERATORS FOR IMPROVED PERFORMANCE

RELATED APPLICATIONS

This application is a continuation application of U.S. application Ser. No. 16/969,524, filed Aug. 12, 2020, entitled "Thermal Lensing Electrode in Thermoelectric Generators for Improved Performance," which is a National Stage Application of PCT/US19/61894, filed Nov. 16, 2019, which claims the benefit under 35 U.S.C. 119(e) to U.S. Provisional Patent Application Ser. No. 62/768,679, entitled "Thermal Focusing Advantages in Thermoelectric Devices for Improved Performance", filed Nov. 16, 2018, the disclosures of which are hereby incorporated by reference in their entirety.

FIELD

The embodiments herein generally relate to thermoelectric devices made from semiconductor components. More particularly, these embodiments relate to design improvements regarding the nature of the electrode in direct contact with the semiconductor pellet, leading to an increase in power output of a thermoelectric generator.

BACKGROUND

Thermoelectric modules have been the subject of alternative power generation research for decades and several products exist within the space of thermoelectric generators used for a source of electrical power from waste heat. The thermoelectric modules can be used for alternative power generation in the Seebeck mode to convert a heat flux into an electrical flux. Inversely, in the Peltier mode, electrical flux can be used to drive heat flux to provide refrigeration. Thermoelectric devices for power generation is one of key drivers of research, because waste heat, which is otherwise lost to the environment, can be recycled into electrical energy and used in a remote location or fed back into the electrical grid through inverters.

However, this approach for electrical power generation has met barriers in terms of a fundamental parameter, cost per watt, in comparison with other methods in alternative power generation, such as solar technology. The major reasons for this cost barrier are inherent to the thermoelectric properties of semiconductor in the devices and the cost of manufacturing of the heat exchanger system to provide hot and cold surfaces required for conversion of the heat energy into electrical energy. Thus, progress in every aspect of manufacturing thermoelectric generators (TEG) is vital if thermoelectric energy production methods are to unfold on a ubiquitous and larger power scale in the production of clean energy conversion, particularly in the megawatt power range and above.

SUMMARY

Systems and methods presented herein provide for a cost-effective approach to large scale production of clean energy by utilizing more area of semiconductor surfaces and pellet volume of a thermoelectric pellet. In one embodiment, a new type of electronic component is proposed for increased performance of thermoelectric generators which uses a favorable coincidence of electrical and thermal properties. One method of building a thermoelectric module (e.g., that operates in Seebeck and/or Peltier modes) is based on a sequentially layered assembly using automated techniques, such as the robotic placement of the components with pick and place equipment. Thermoelectric modules can be made in this manner for high volume production.

In one embodiment, a TEG is configured as a semiconductor comprising a shape that is, in general, cuboid or cylindrical, though the shape can have any form that allows the thermal focusing effects, such as a rectangular parallelpiped, spherical, truncated cone, or other such polyhedrons where thermal energy can be directed through the use of corners and vertices of adjacent sides of the semiconductor pellet. Two metal electrodes may be used to electrically and thermally bond each pellet to electrical interconnects and form a series circuit, conducting the current generated by the thermoelectric effect in the presence of a thermal gradient. Thus, an array of pellets arranged in such a manner can be packaged to form a module, typically a flat package.

Generally, two flat metal electrodes of the pellet are placed on directly opposing parallel surfaces of the pellet and are attached conveniently to interconnects by printing a solder paste on the interconnects. Solder may then be reflowed to complete the bonding process between the parts. More particularly, the present embodiments relate to design improvements regarding the geometric nature of the electrodes intimately bonded to the pellet, leading to an increase in overall performance of thermoelectric devices through the focusing of thermal energy within the bulk of the pellet. Power output of the TEG may be increased significantly from the nature of the isothermal contours within the pellet.

The components for the thermoelectric effect are pellets of semiconductor materials, where the materials have suitable thermoelectric properties in accordance with their dopants. Usually two types of materials are required in fabricating a thermoelectric device, one with electrons as the majority charge carrier (N-type), and one with holes as the majority charge carrier (P-type). Typically, each pellet has a cuboid shape and has two opposing planar electrodes on parallel planes on the two surfaces of pellets, one hot and one cold, for thermal and current injection on the hot side in standard circuit layouts. The isotherms generated in the pellet volume between the hot and cold electrodes of the pellet are therefore planar and parallel to the electrodes. Thus, the thermal gradient vectors normal to the isotherms within the pellets are parallel to the planes of the sidewalls of each pellet from the top to the bottom of the pellet, and the vector of the electrical current generated through the thermoelectric effect is generally parallel with the thermal gradient vector in the bulk of each pellet. Such a geometric arrangement fixes the area of the isotherms to that of the area of the electrodes of the pellet.

Collectively, the electrical current between the pellets in a module are connected in series by placing planar electrical interconnects on the bottom and top half of the package to provide heat transfer and electrical continuity. The electrical interconnects, typically copper, also provide the module's output electrodes. Hence the layout for thermoelectric modules has a device geometry that is convenient for methods of surface mount technology.

In addition, a pellet is typically a cuboid shape because it is a space-filling shape, while cylindrical pellets are not. The higher the packing density of active thermoelectric pellets generally results in more active volume there is in the module to either convert heat to electrical energy in a generator and/or providing active cooling in the Peltier mode. Herein, a cuboid will be referred to as a square pellet, where two sides are of equal length and the height, or thickness, has a different value.

Heat transfer into the pellets is generally only limited to the top and the bottom surfaces of the cuboid (or cylindrical) pellets. The modification of thermal transfer to the bulk of the semiconductor pellet is analyzed herein, and a method that enhances the effective area of heat transfer for the thermoelectric effect is provided through the heat transfer by using the pellet sidewalls as a pathway for heat transfer from most of the area of the sidewalls. The increase in the module output power from this new kind of component electrode may be achieved by increasing the effective area for the thermoelectric effect through the modification of the isotherms within the bulk of the pellet. There are both linear and non-linear effects of the power output from thermoelectric effect resulting from an effective area increase. The thermoelectric conversion of focused heat energy into electrical energy generally results in more output power per pellet volume in the case of a thermoelectric generator.

In one embodiment, a thermoelectric device includes a pellet comprising a semiconductor material, a first metal layer surrounding a first portion of the pellet, and a second metal layer surrounding a second portion of the pellet. The first and second metal layers are configured proximate to one another about a perimeter of the pellet. The pellet is exposed at the perimeter. The perimeter is configured at a sidewall height about the pellet to provide a non-linear effect on a power output of the thermoelectric device by modifying an isotherm surface curvature within the pellet. The device also includes a metal container thermally and electrically bonded to the pellet.

In another embodiment, the isotherm surface curvature within the pellet is operable to increase an effective surface area of a thermoelectric effect within a volume of the pellet via heat injection through the sidewalls. In another embodiment, the first and second metal layers comprise a higher thermal conductivity than the pellet. For example, at least one of the first and the second metal layers comprises copper. In another embodiment, at least the pellet and the second metal layer are configured in a shape (e.g., cuboid and/or cylindrical) that is operable to increase a thermal lensing effect of the thermoelectric device.

In one embodiment, the first and the second metal layers are electrically isolated from one another. In this regard, the first metal film and the pellet may include beveled edges proximate to the perimeter of the pellet to electrically isolate the first and the second metal layers from one another.

In one embodiment, a method making a thermoelectric device includes metalizing a plurality semiconductor pellets with one or more layers of metal, and removing a portion of the metal layers about a perimeter of the semiconductor pellets to create a gap with each of the semiconductor pellets that exposes the semiconductor pellets. The method also includes forming a plurality of cups from copper, electroplating the cups with nickel, and coating a portion of the cups with solder. The method also includes placing one of the pellets in each of the cups such that a sidewall height of each cup matches a gap location of each pellet to provide a non-linear effect on a power output of the thermoelectric device by modifying isotherm surface curvatures within the pellets, curing the solder to adhere the pellets to the cups, and mounting the cups to a substrate to form the thermoelectric device.

BRIEF DESCRIPTION OF THE DRAWINGS

The disclosure will be readily understood by the following detailed description in conjunction with the accompanying drawings, wherein like reference numerals designate like structural elements, and in which:

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

Some embodiments are now described, by way of example only, and with reference to the accompanying drawings. The same reference number represents the same element or the same type of element on all drawings.

Figure 1:
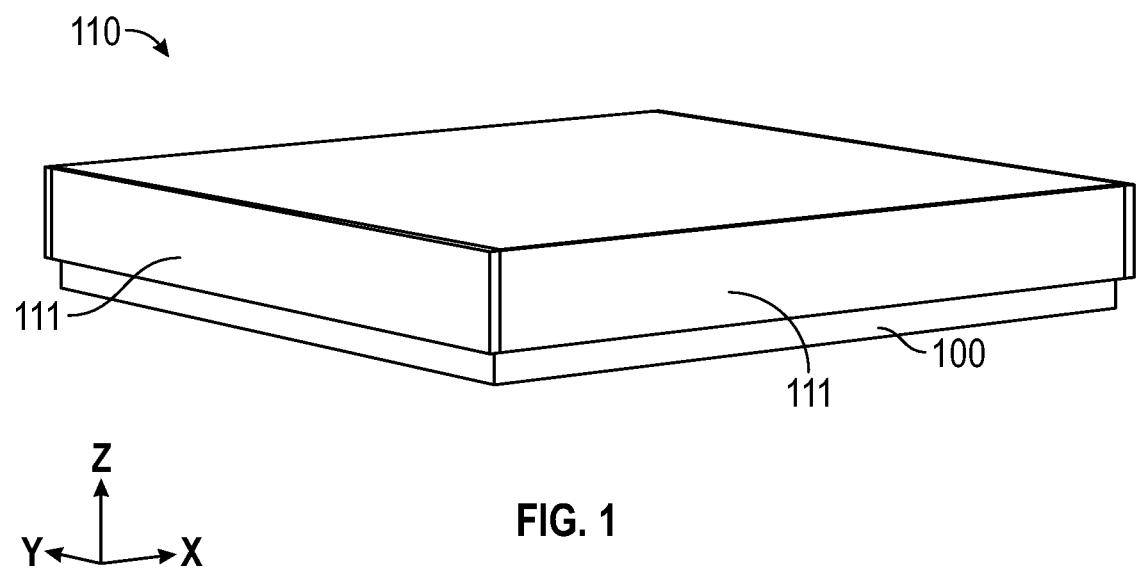

FIG. 1 shows one exemplary square semiconductor pellet with four thermally conductive sidewalls (TEFP).

Figure 2:
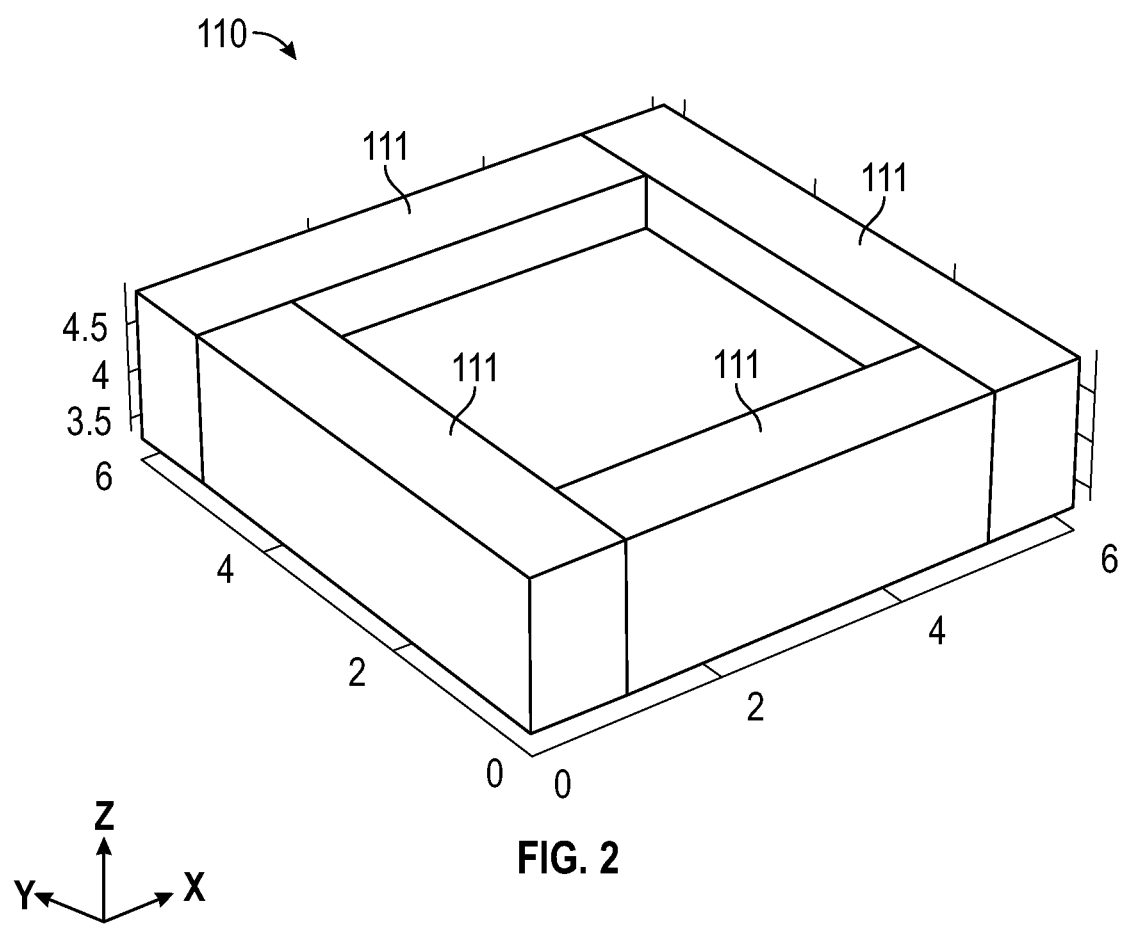

FIG. 2 shows one exemplary Thermal Lensing Electrode (TLE) component.

Figure 3:
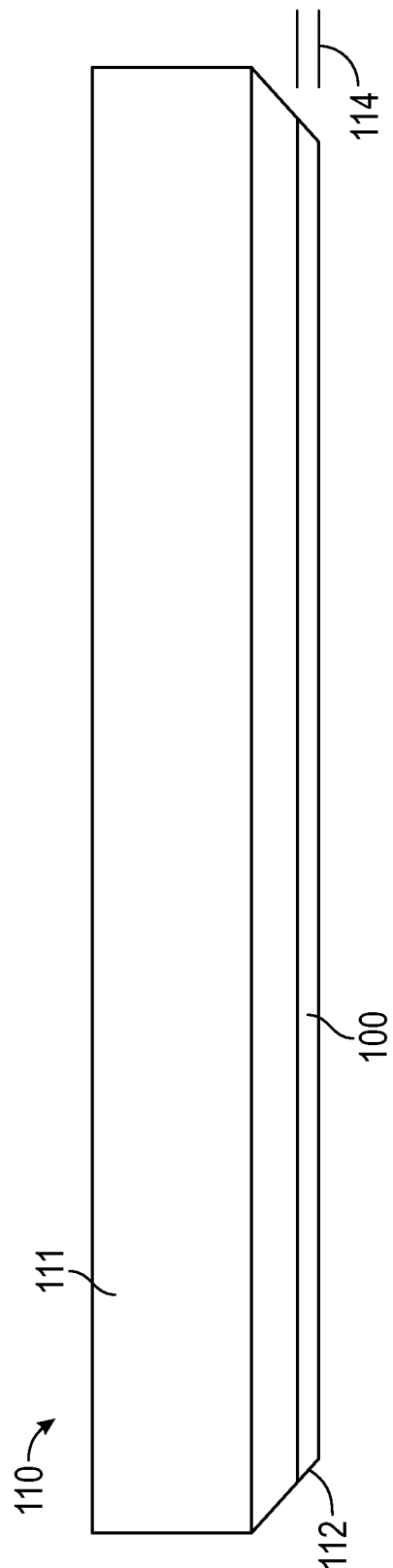

FIG. 3 shows one exemplary Thermally Enhanced Thermoelectric Component (TETC) component using a square semiconductor pellet with four thermally conductive sidewalls.

Figure 4:
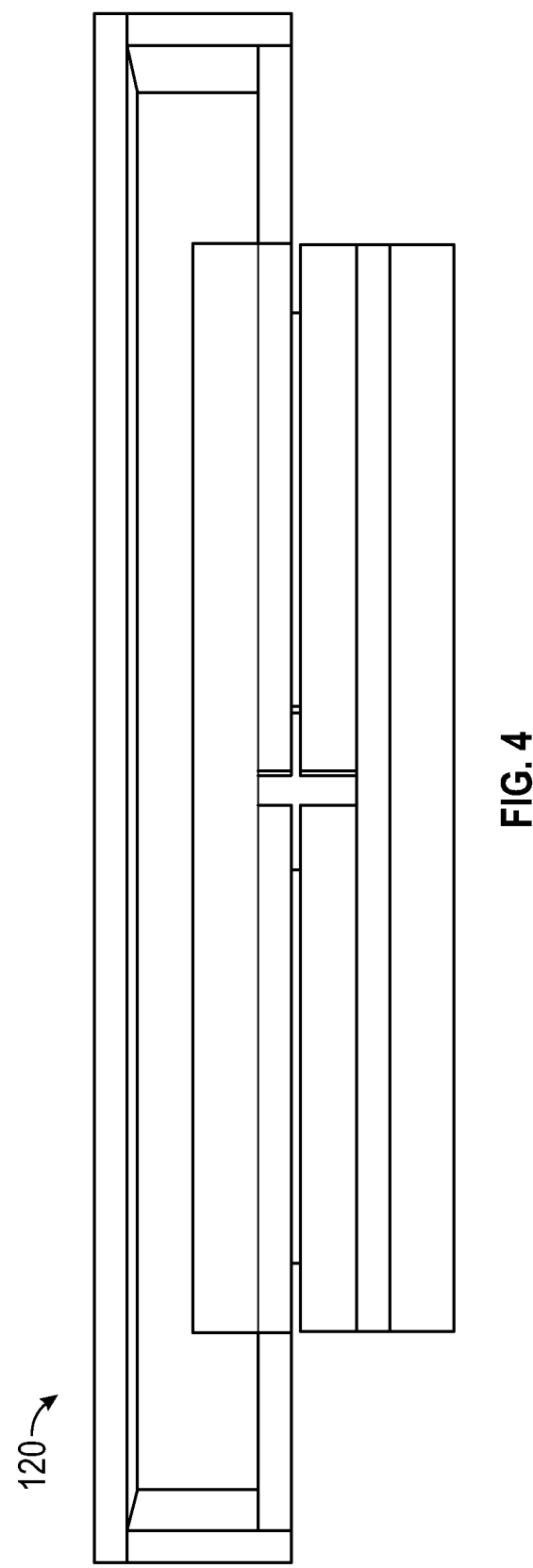

FIG. 4 shows one exemplary single thermocouple pair device comprising two square semiconductor pellets with four copper sidewalls.

Figure 5:
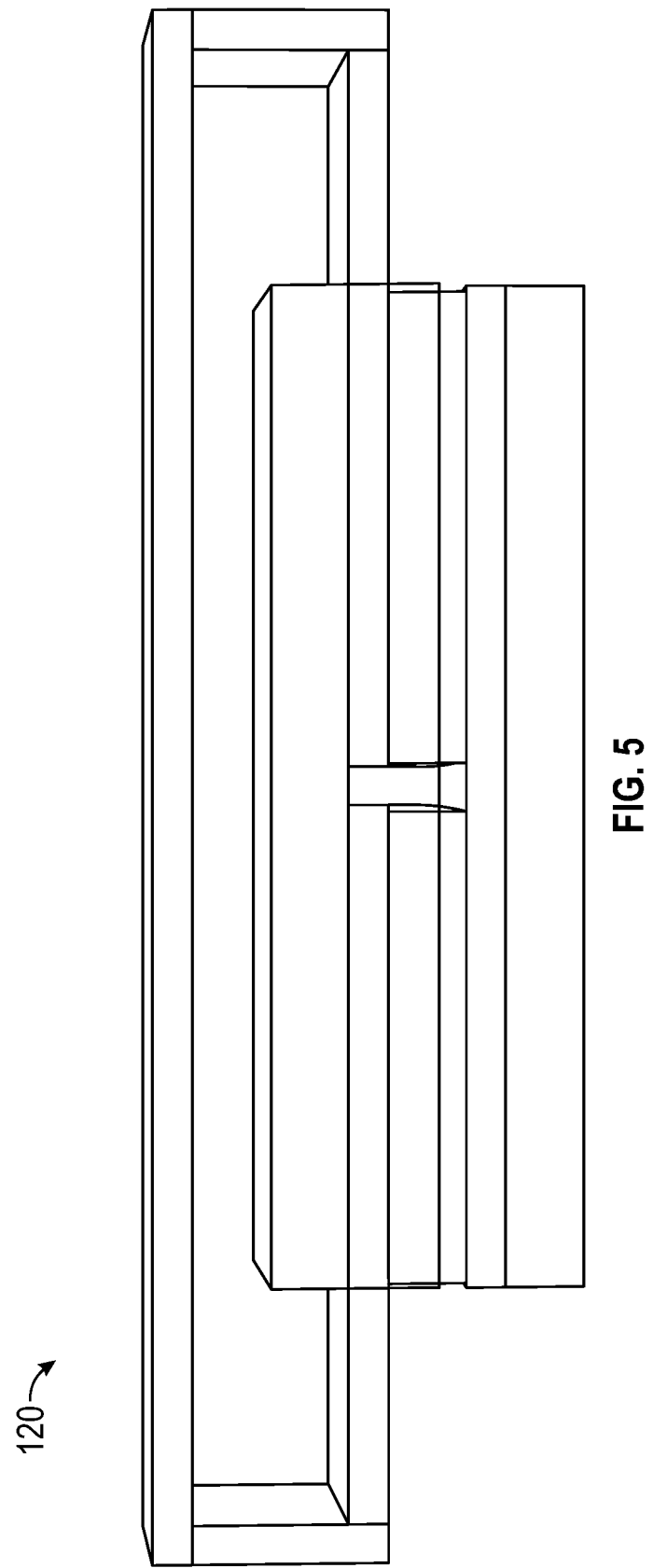

FIG. 5 shows one exemplary single thermocouple pair device with four copper sidewalls.

Figure 6:
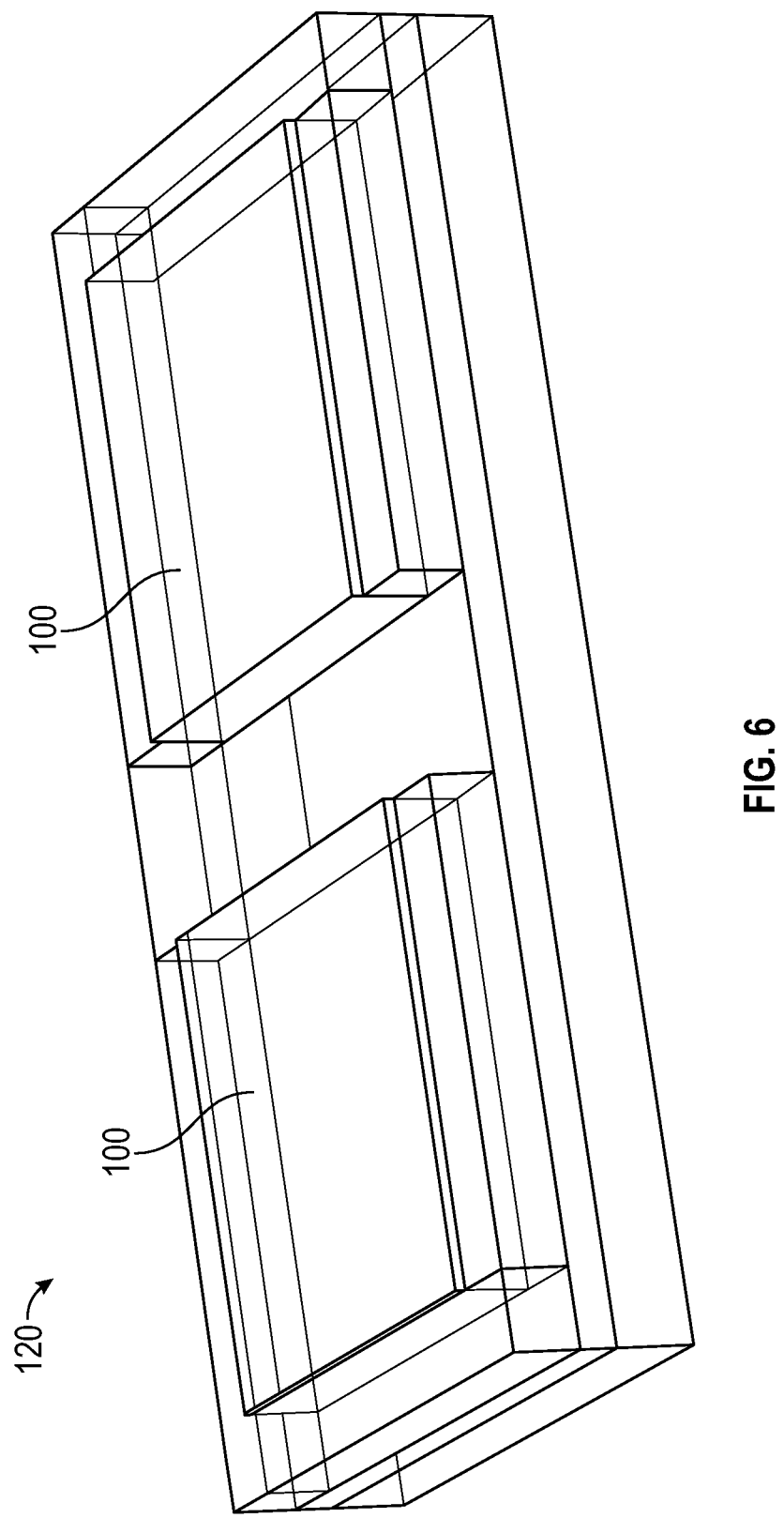

FIG. 6 shows exemplary bottom components of the thermocouple device with a transparent rendering.

Figure 7:
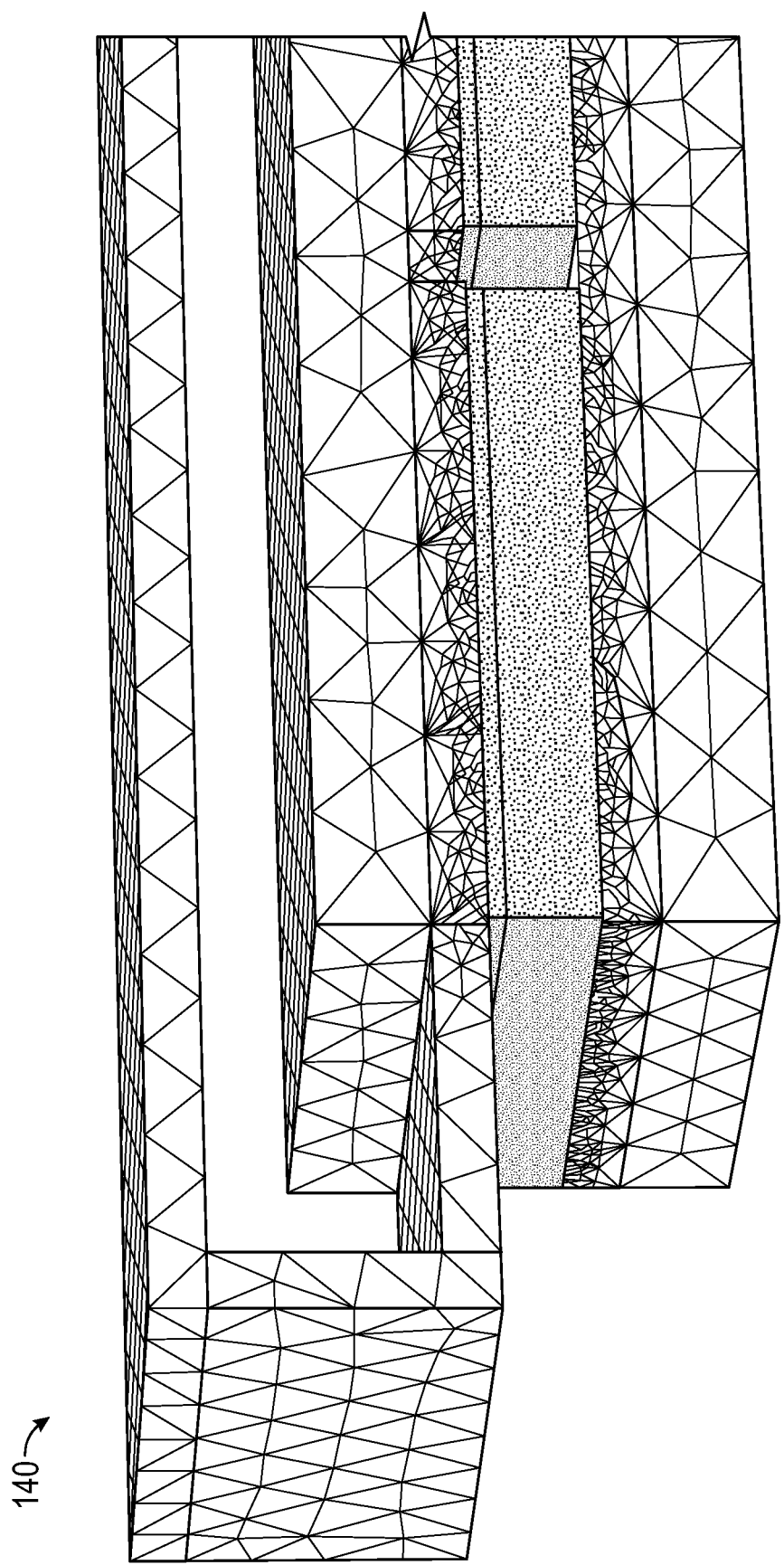

FIG. 7 is one exemplary computational mesh in a thermocouple pair circuit for the case of sidewalls beginning at top of the pellet.

Figure 8:
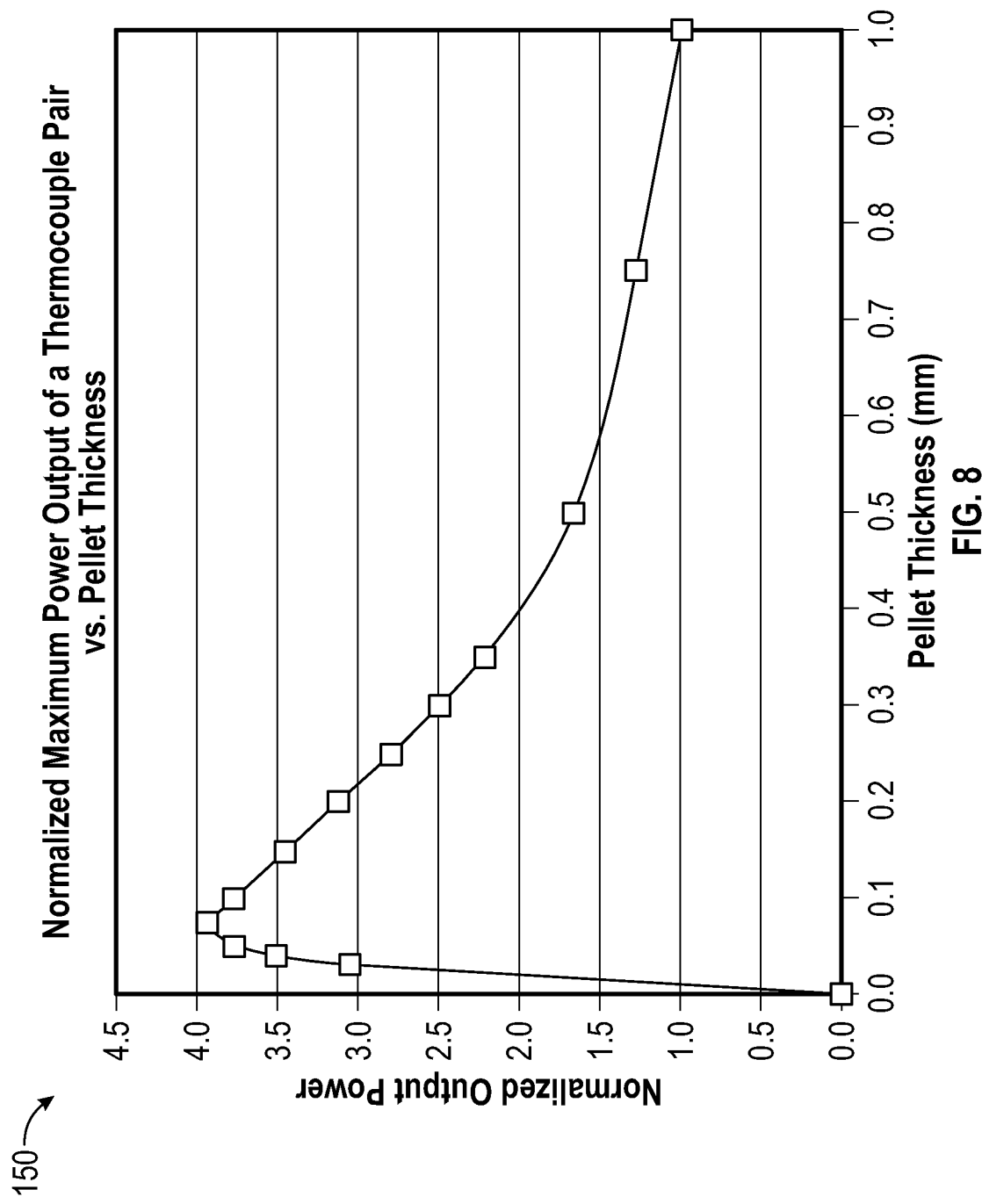

FIG. 8 shows the relationship between device power of a thermocouple pair circuit and pellet thickness normalized to the power output of a pellet device.

Figure 9:
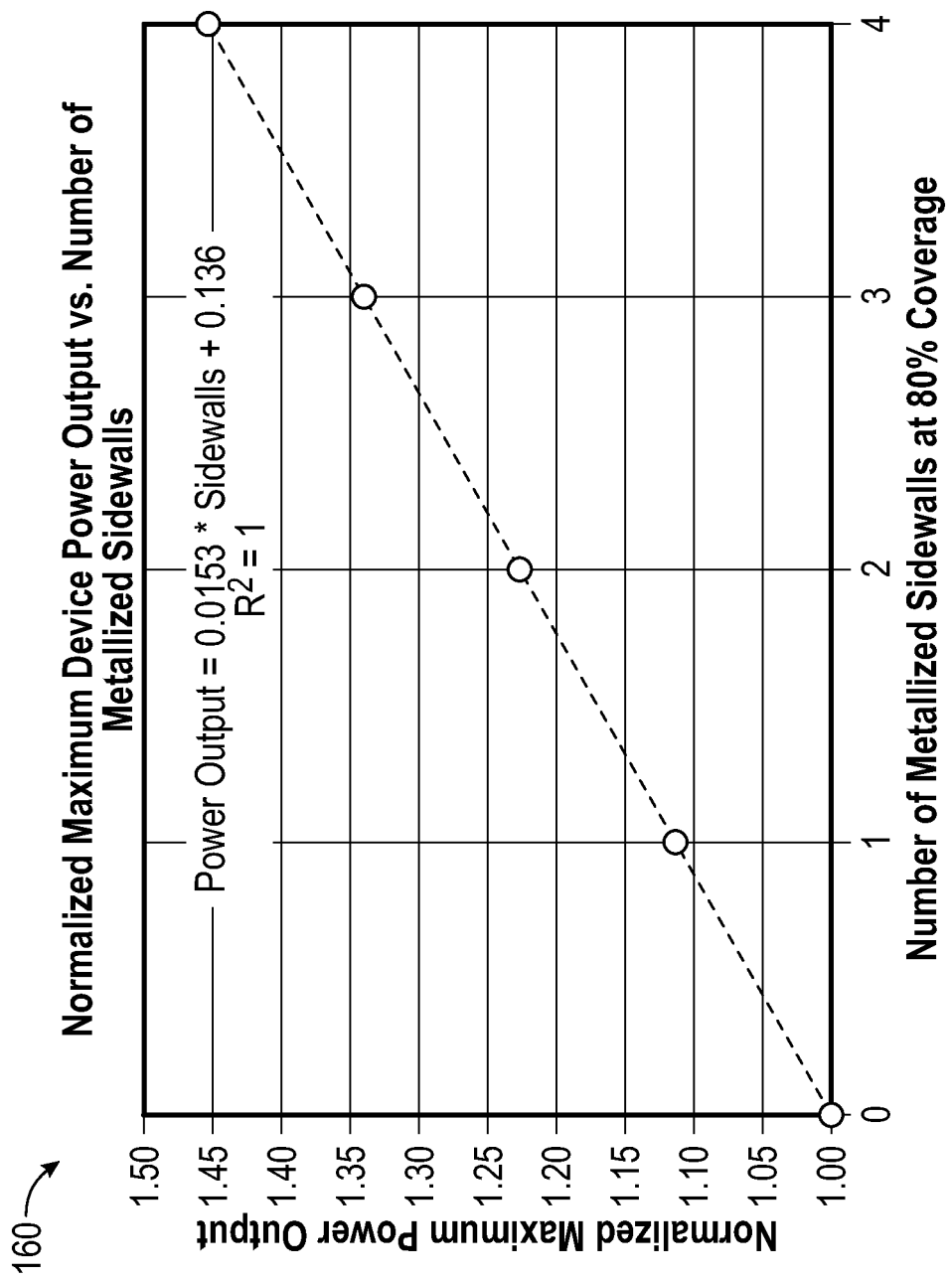

FIG. 9 shows the normalized linear maximum power output with respect to a pellet with no metal sidewalls.

Figure 10:
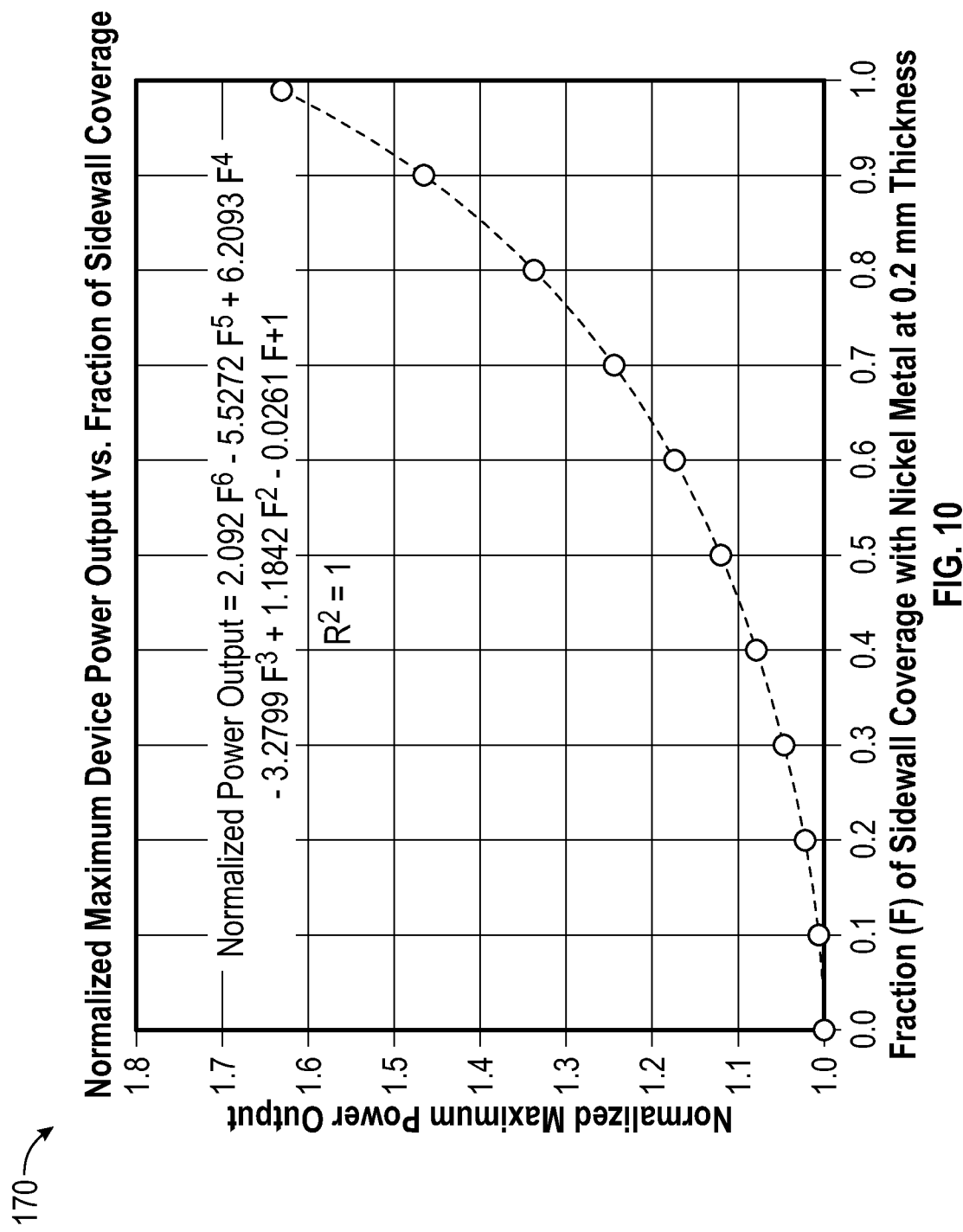

FIG. 10 reveals the normalized nonlinear maximum power output with respect to a pellet with no metal sidewalls for a 1 mm thick pellet vs. the fraction of nickel metal sidewall coverage.

Figure 11:
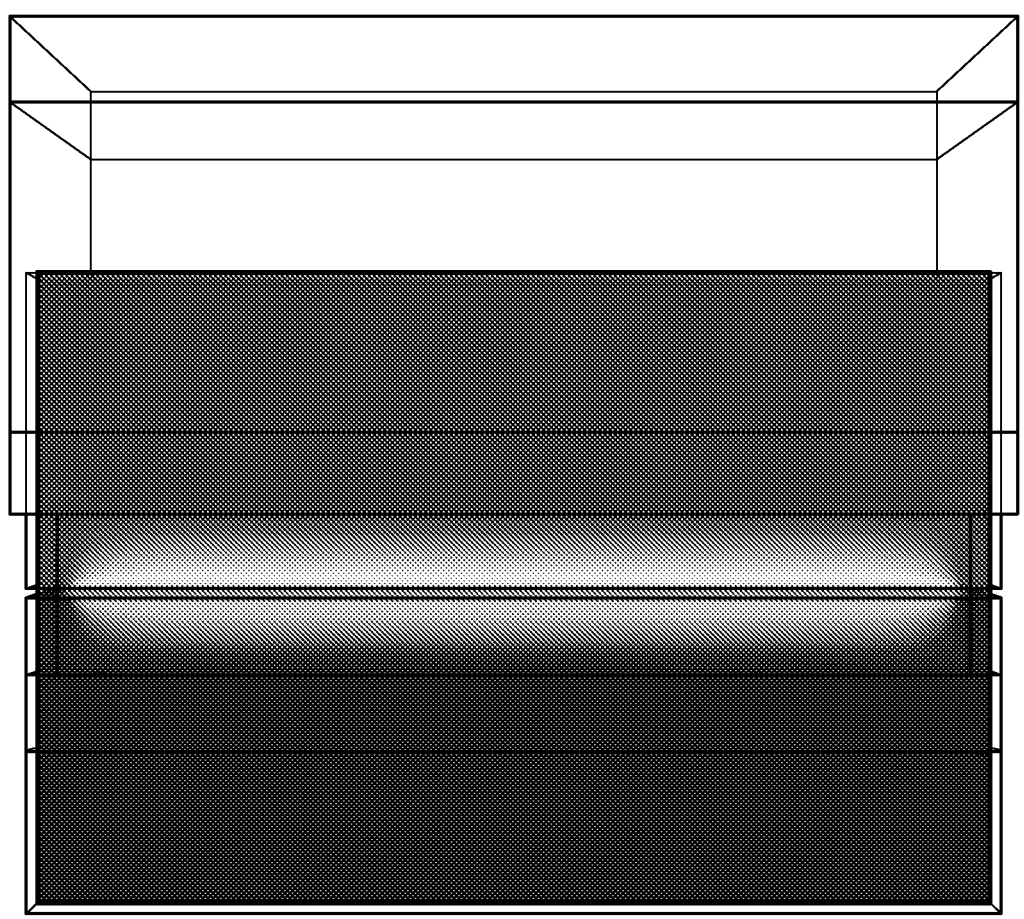

FIG. 11 shows one exemplary cross section of the thermal gradient through the center of a pellet for sidewall metal causing thermal lensing for the case of sidewall thickness of 0.05 mm aperture centered at 0.5 mm of the pellet height (e.g., thermal lensing being present symmetrically in both the upper and lower halves of the pellet).

Figure 12:
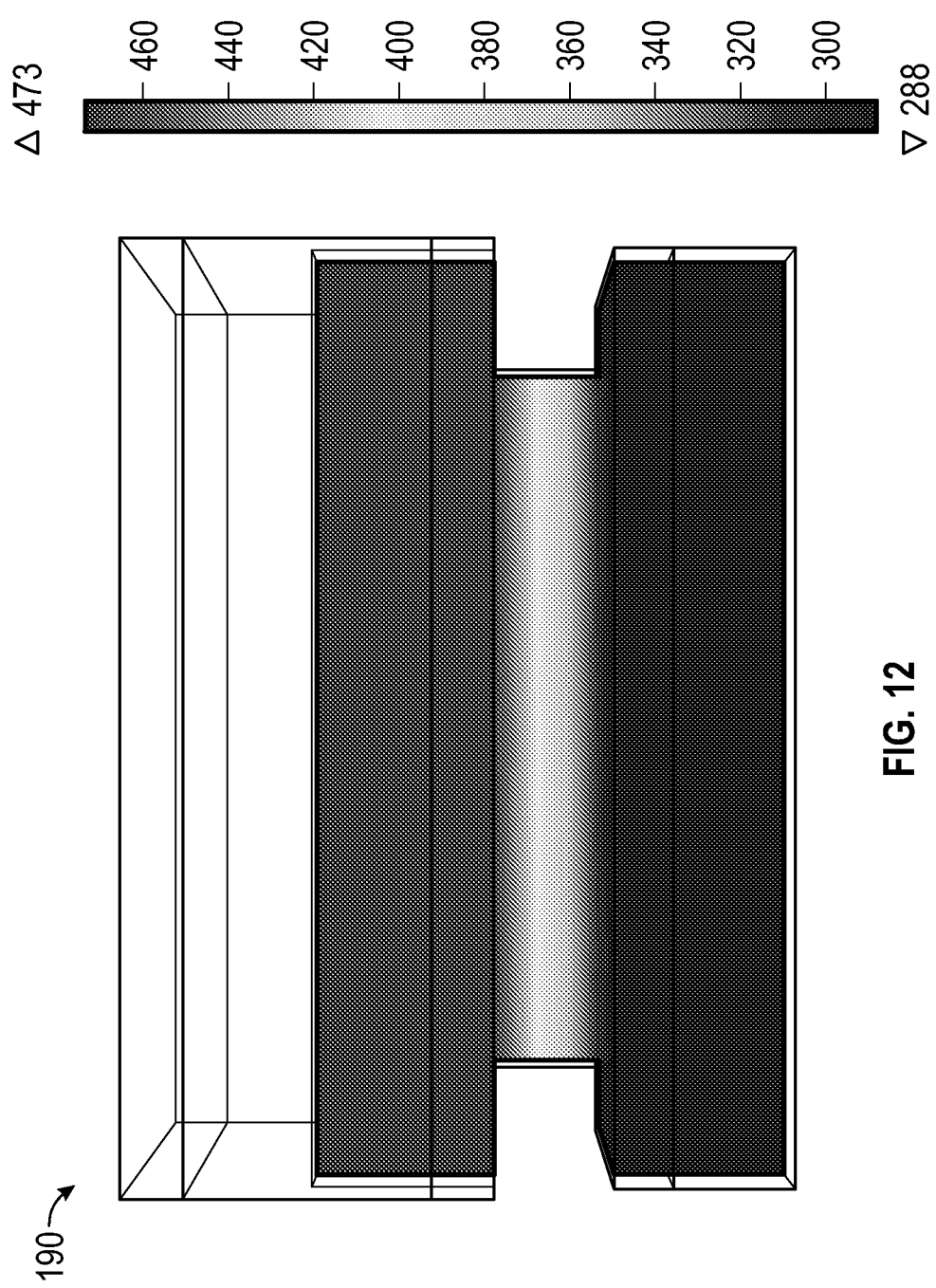

FIG. 12 shows one exemplary cross section of the thermal gradient of 100° C. through the center of a pellet for the case of no sidewall metal, resulting in planar isotherms.

Figure 13:
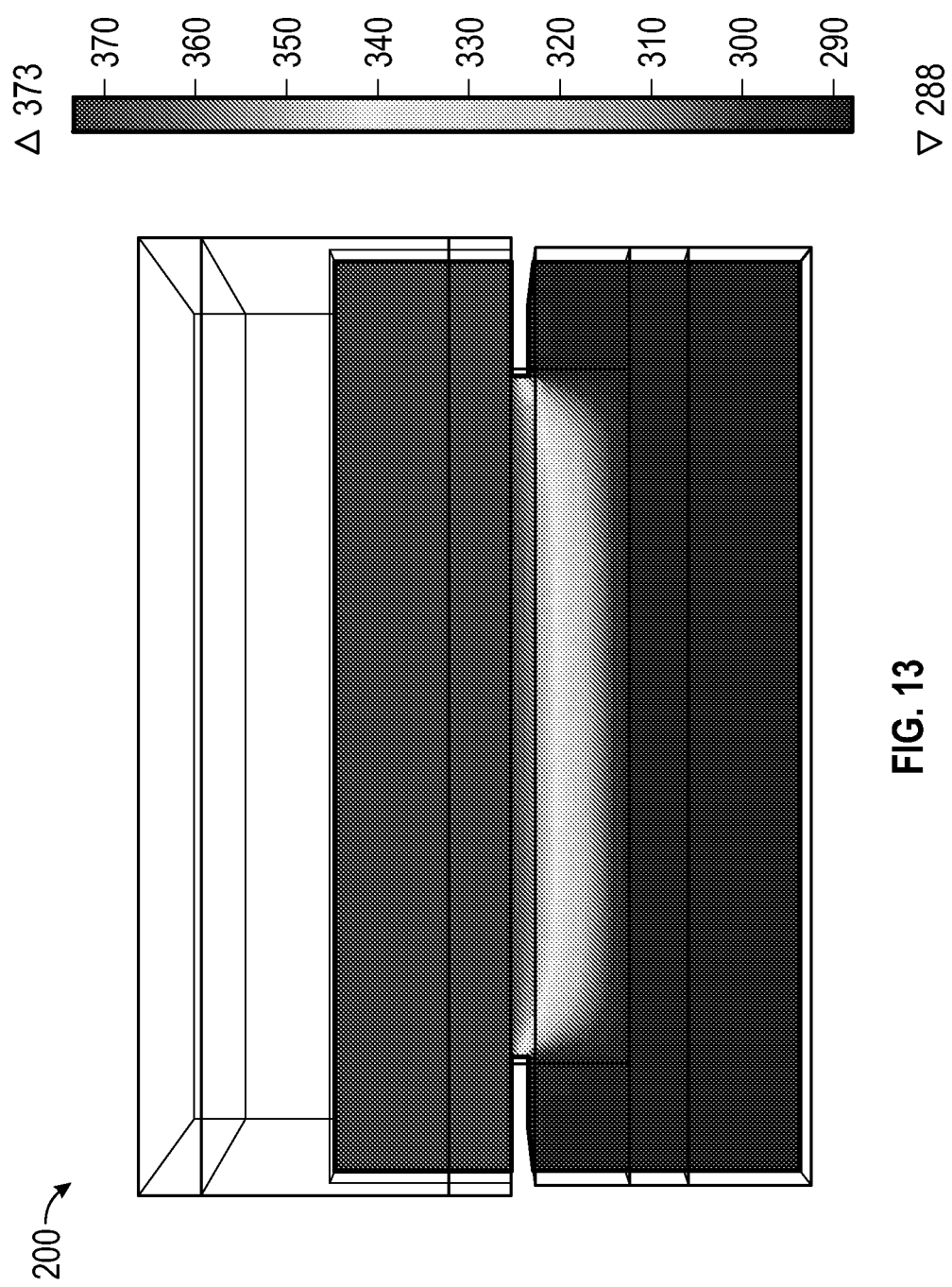

FIG. 13 shows one exemplary thermal focusing for the case of an 0.1 mm wide aperture located at the top of the pellet for a sidewall thickness of 1 mm.

Figure 14:
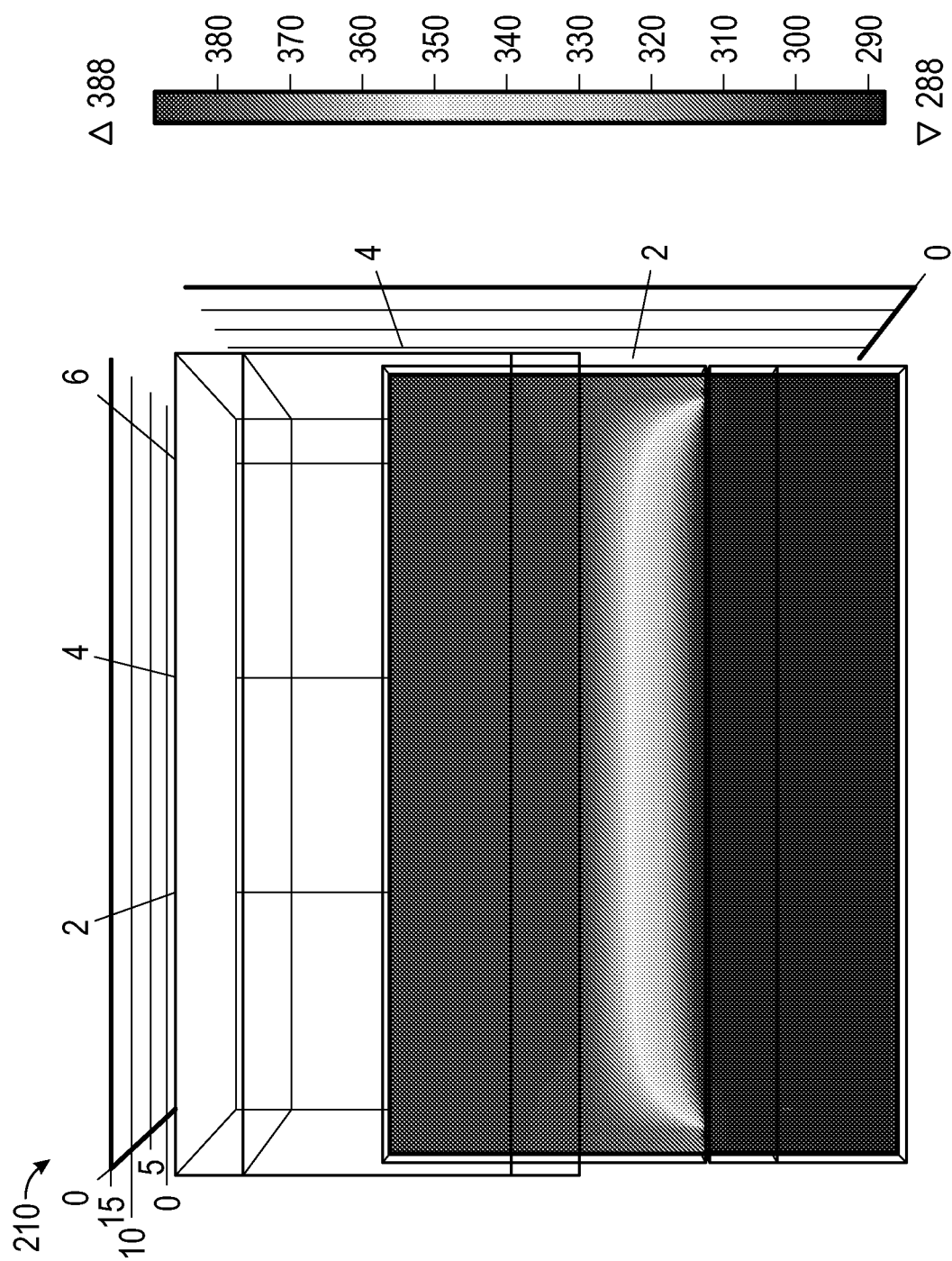

FIG. 14 shows one exemplary thermal focusing for the case of a 0.05 mm wide aperture located at the bottom of the pellet for a nickel thickness of 0.2 mm.

Figure 15A:
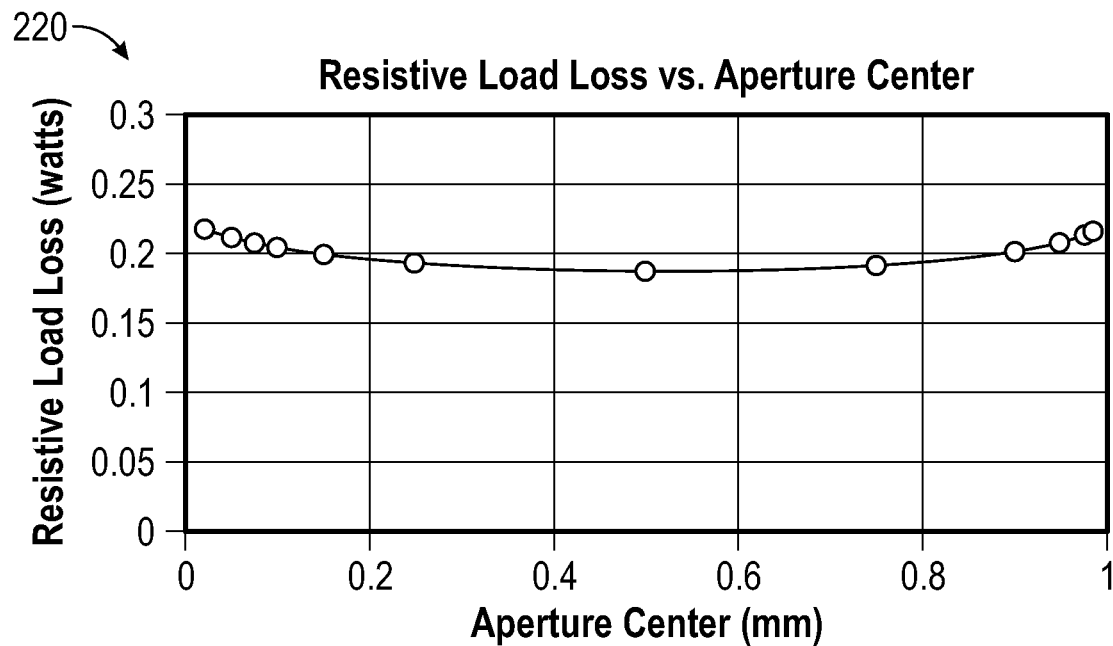

FIG. 15A shows an exemplary resistive load loss of a thermocouple pair as a function of the center of a metal aperture.

Figure 15B:
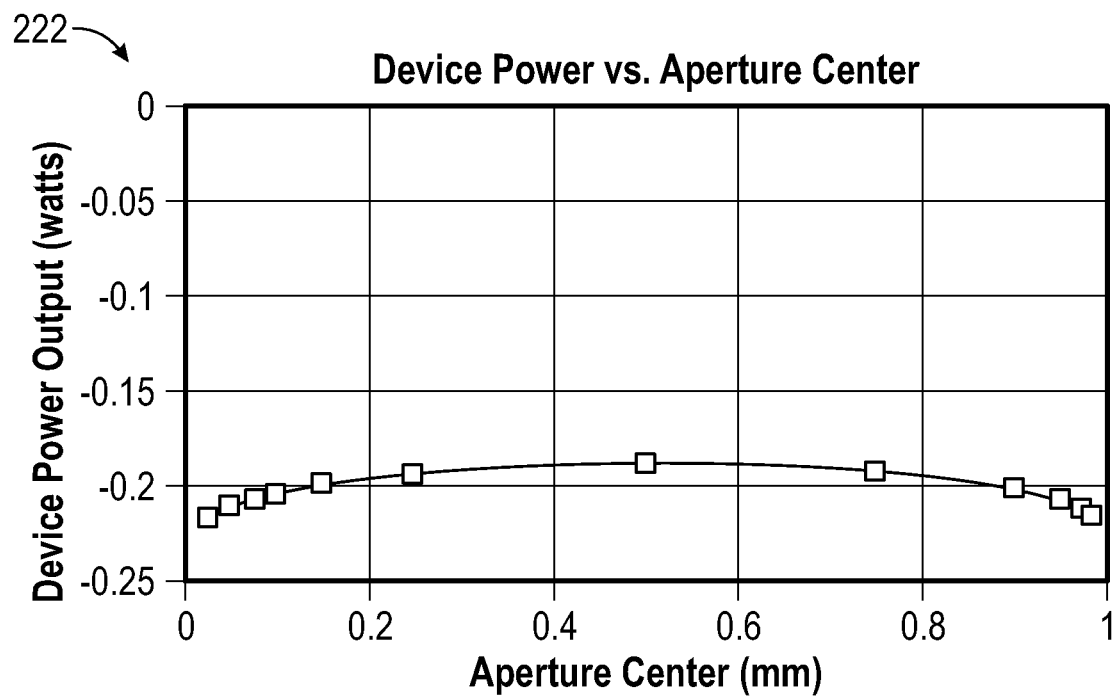

FIG. 15B shows the device power output of the same thermocouple pair.

Figure 16:
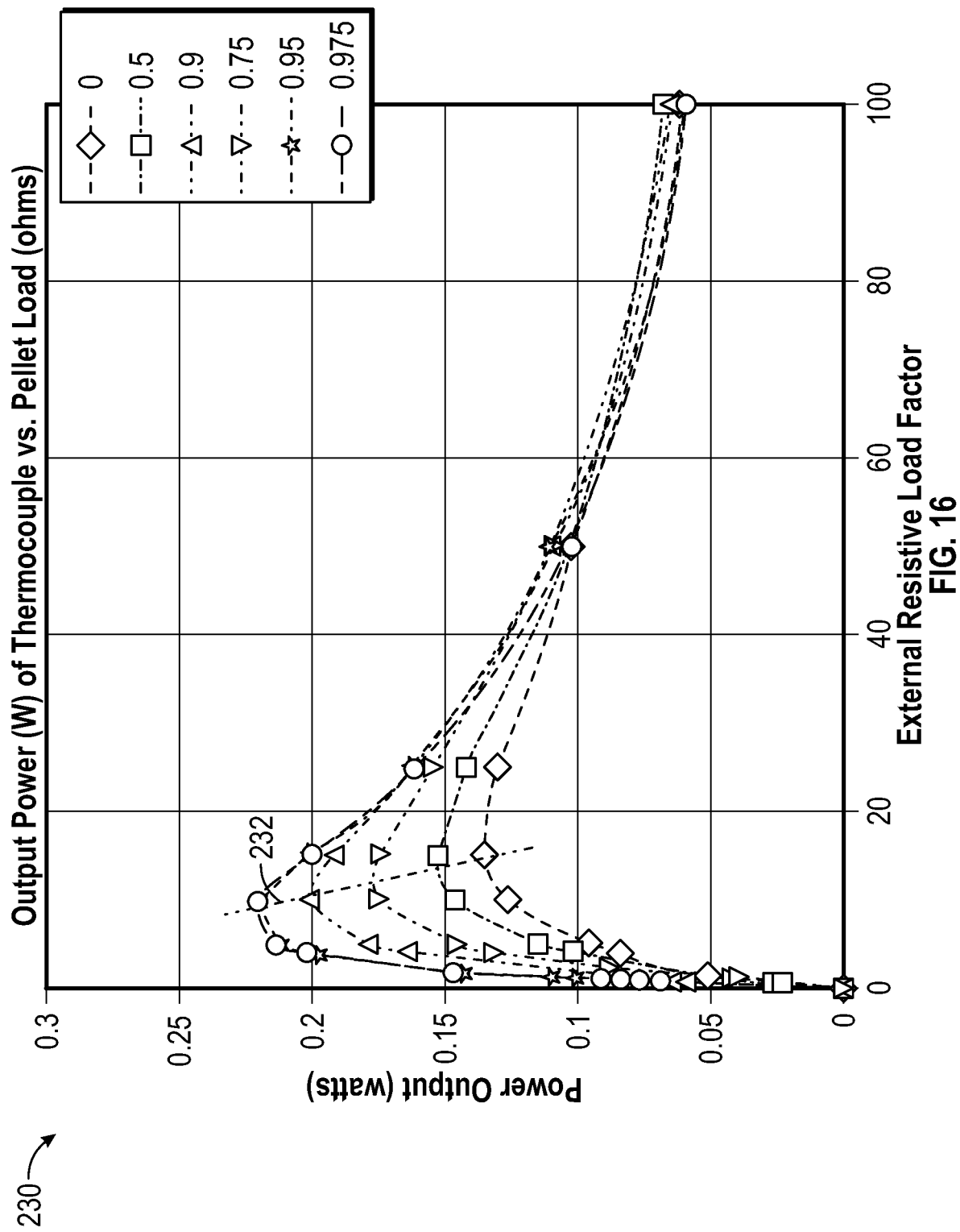

FIG. 16 shows an exemplary maximum device power output vs. external resistive load factor with fraction of nickel metal sidewall coverage as a parameter.

Figure 17:
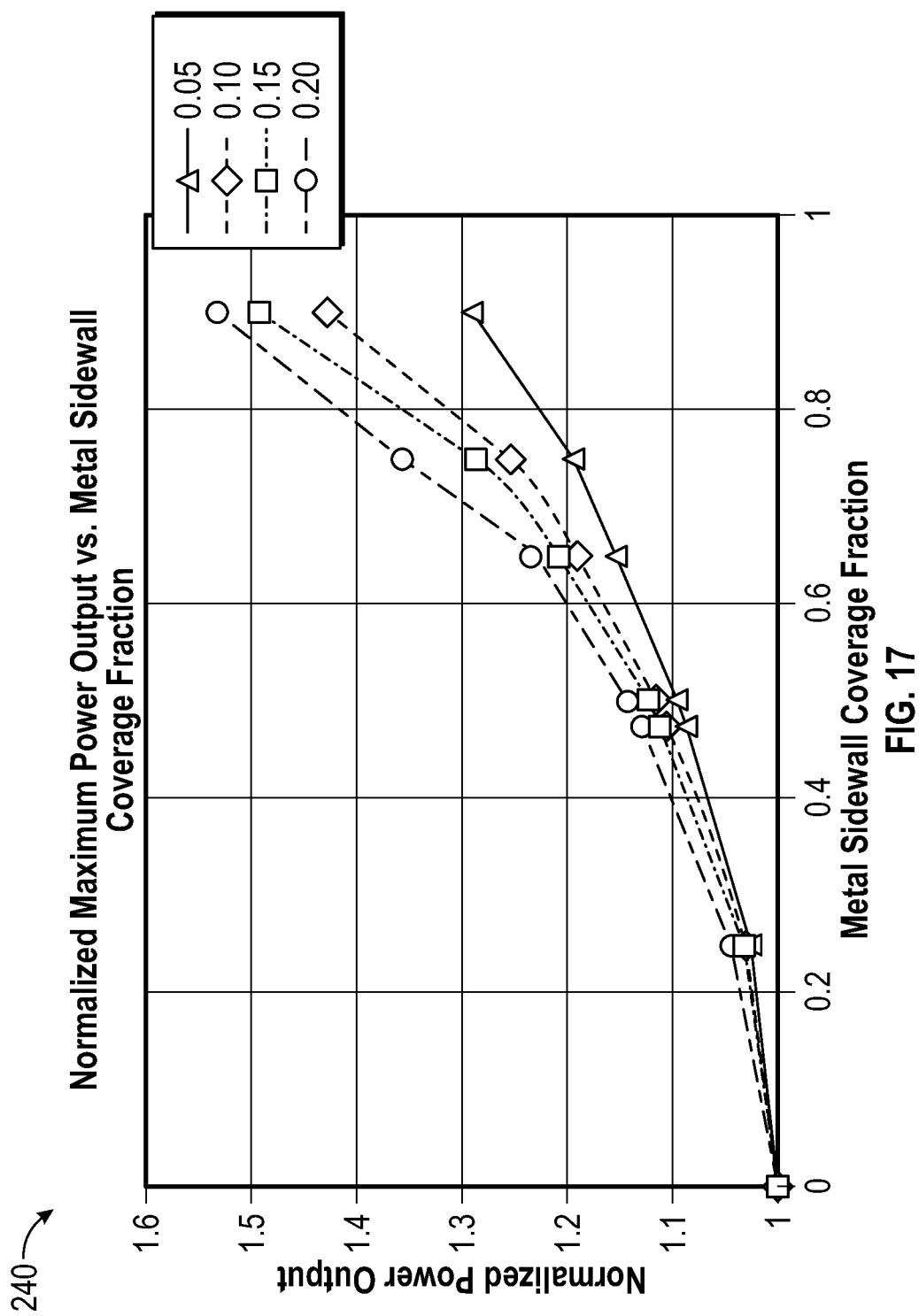

FIG. 17 shows one exemplary parametric relationship between normalized maximum power output of a thermocouple pair versus the fraction of metal sidewall coverage with metal thickness as a parameter.

Figure 18:
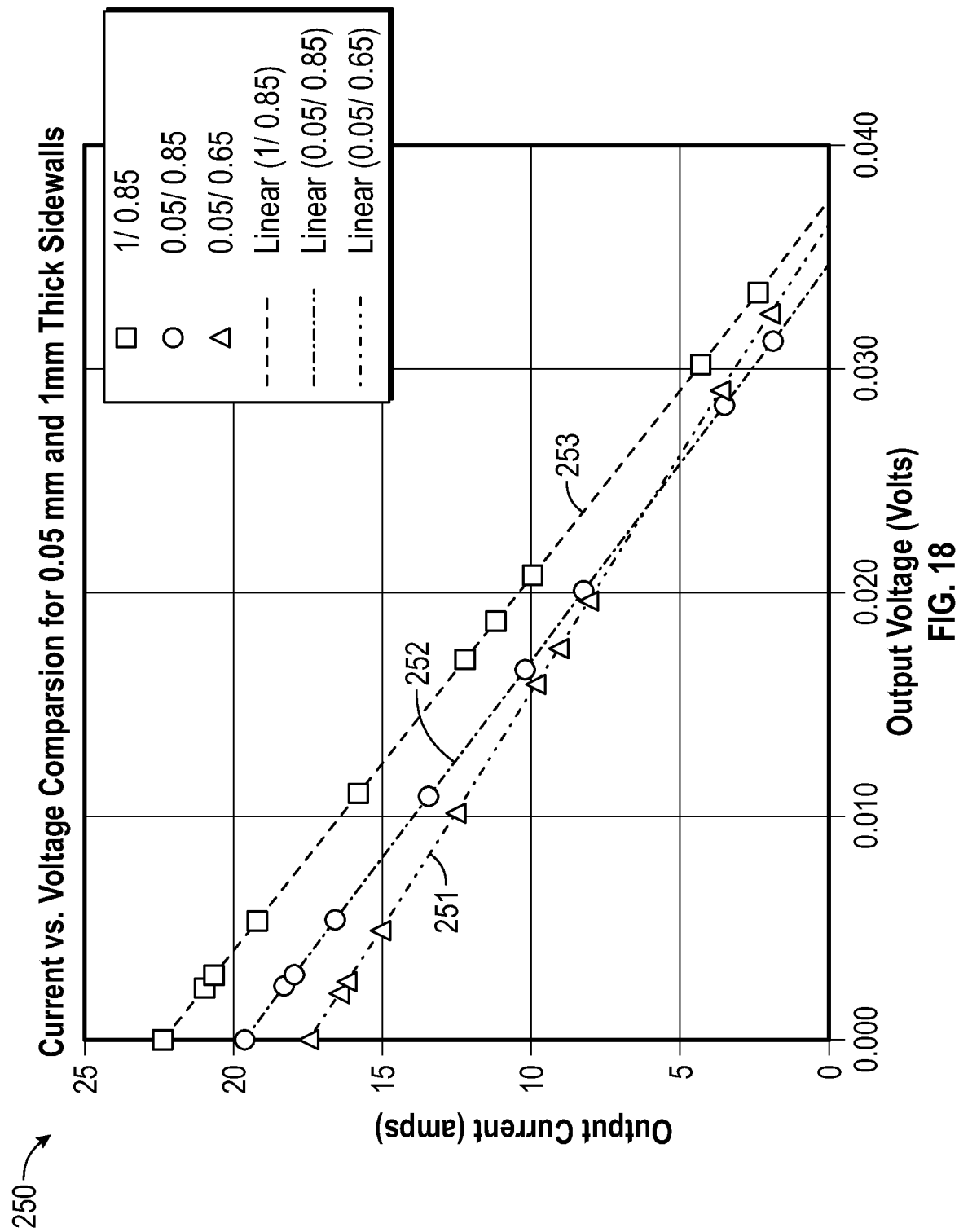

FIG. 18 shows exemplary current-voltage load lines of three thermocouple pair devices with metal sidewall coverage on all four sidewalls.

Figure 19:
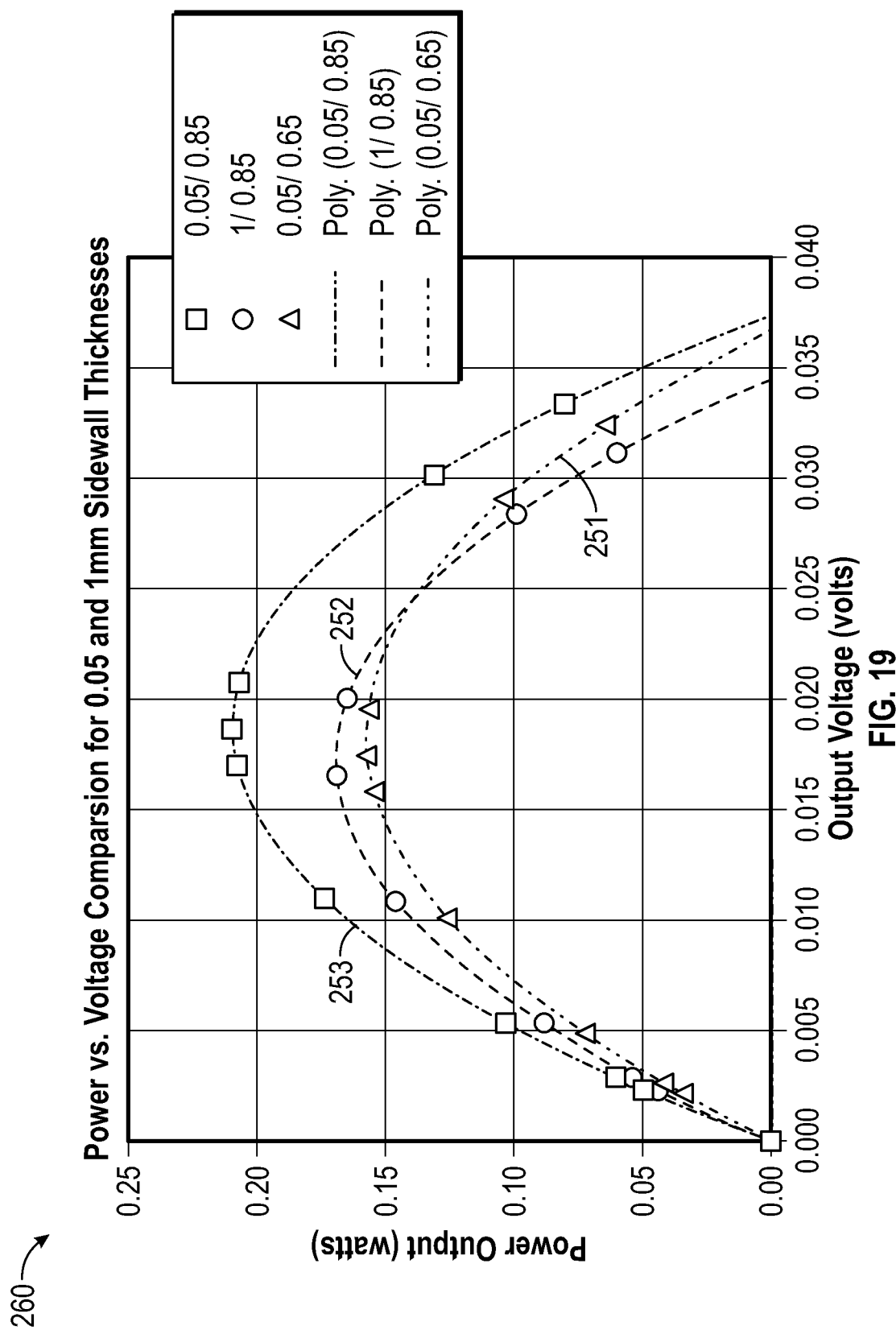

FIG. 19 shows one exemplary power-voltage relationship of three thermocouple pair devices in FIG. 18.

Figure 20:
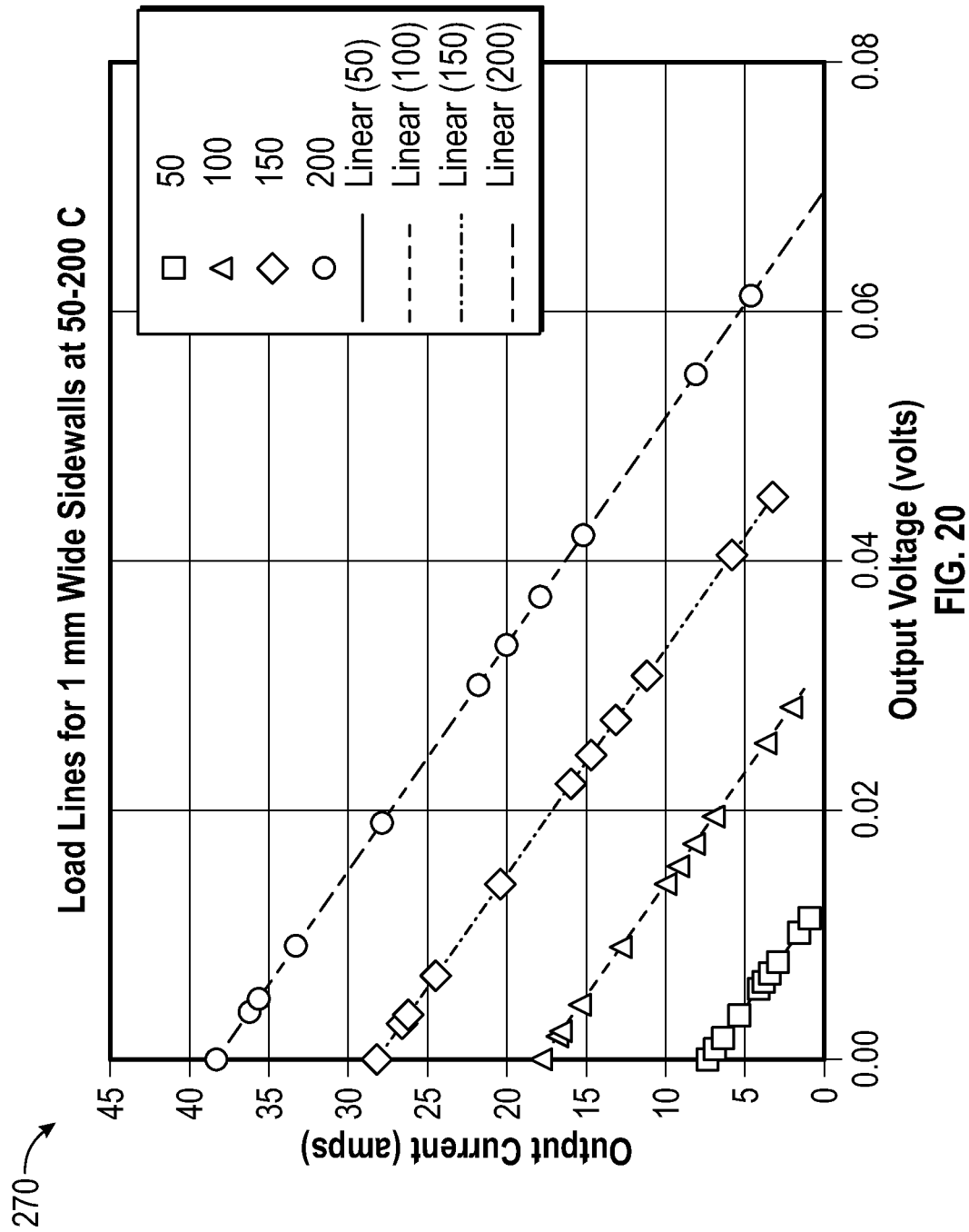

FIG. 20 shows exemplary current-voltage load lines for four temperatures (50° C., 100° C., 150° C., 200° C.) for the case of three sidewalls at 1 mm thickness.

Figure 21:
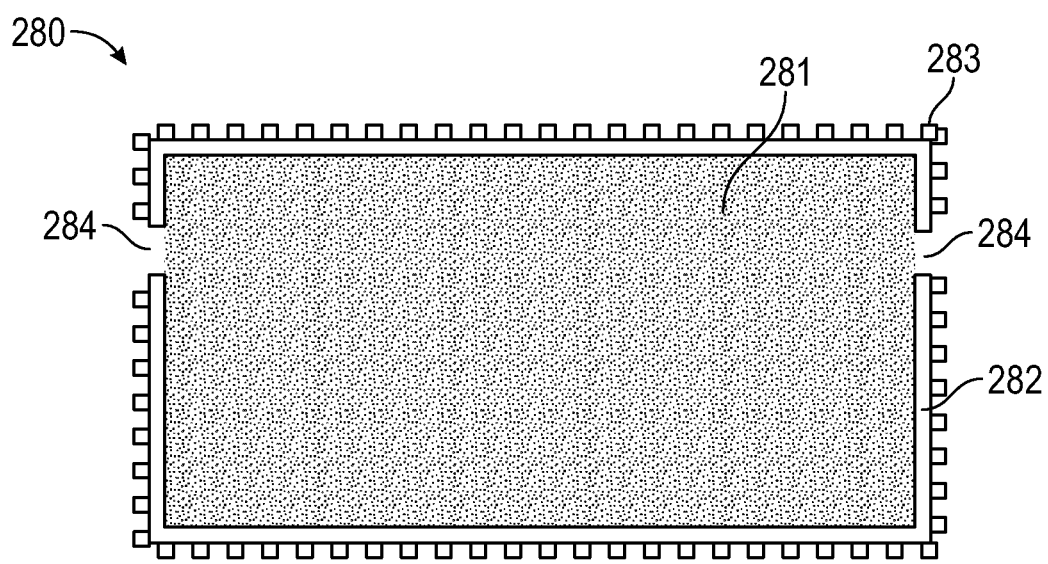

FIG. 21 shows one exemplary thin metallized pellet ready for bonding with a TLE component.

Figure 22:
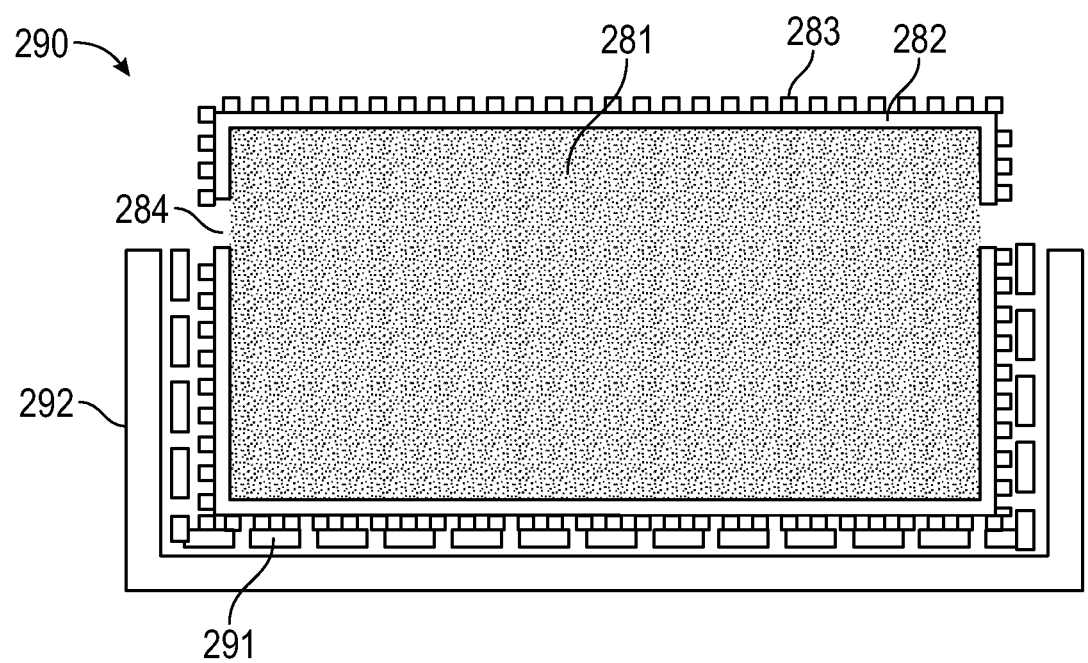

FIG. 22 shows one exemplary sub-component layers of a TETC (e.g., a metallized pellet, a solder layer, and the TLE, which collectively constitute the TETC).

Figure 23:
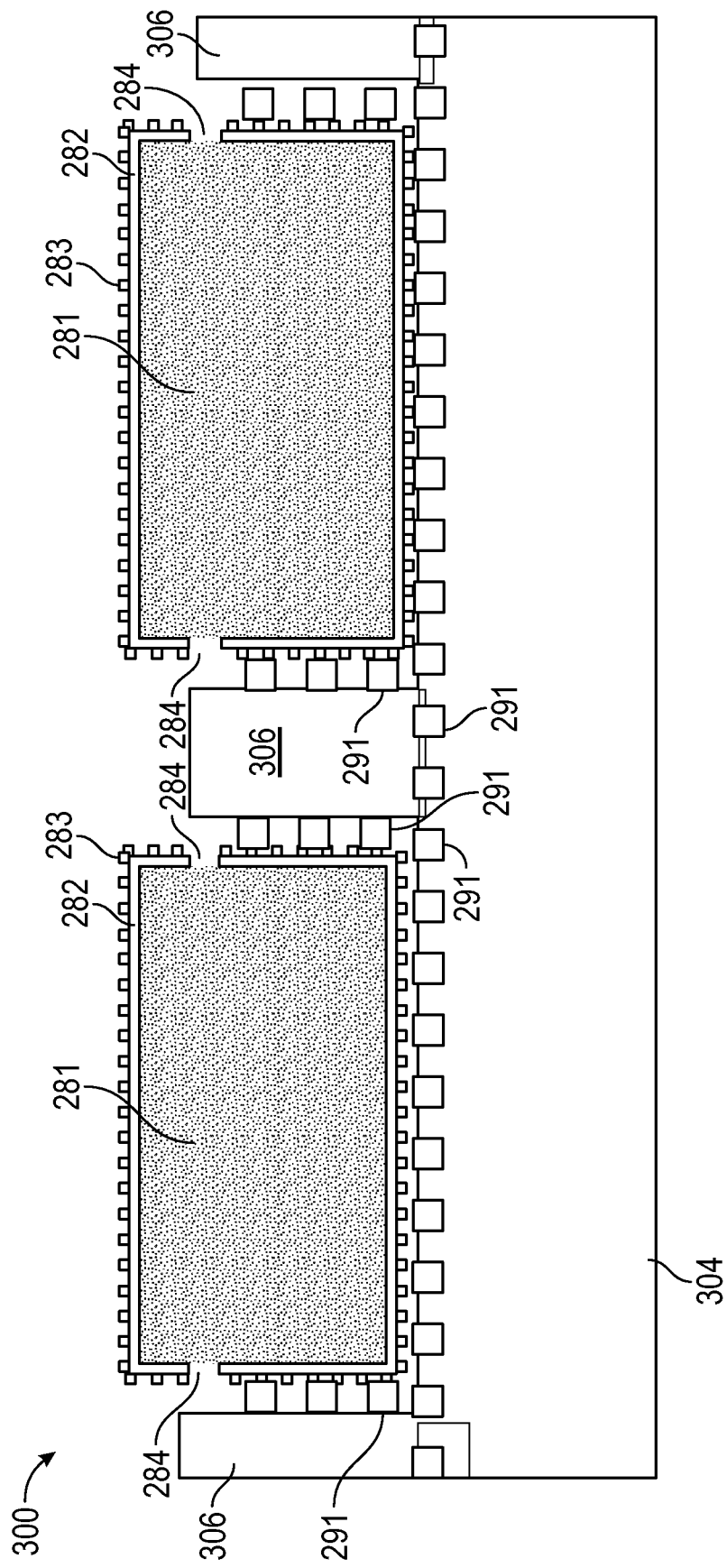

FIG. 23 shows one exemplary method of component packaging geometry of a TETC.

Figure 24:
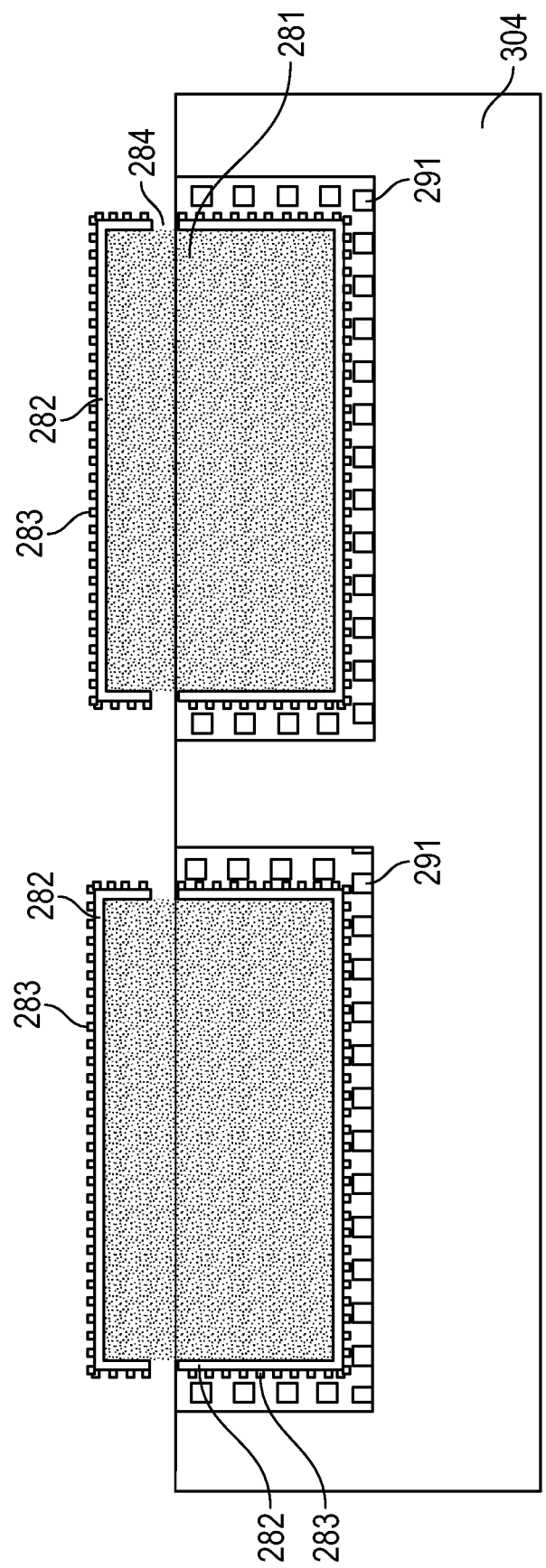

FIG. 24 shows another exemplary method of component packaging geometry of a TETC.

Figure 25A:
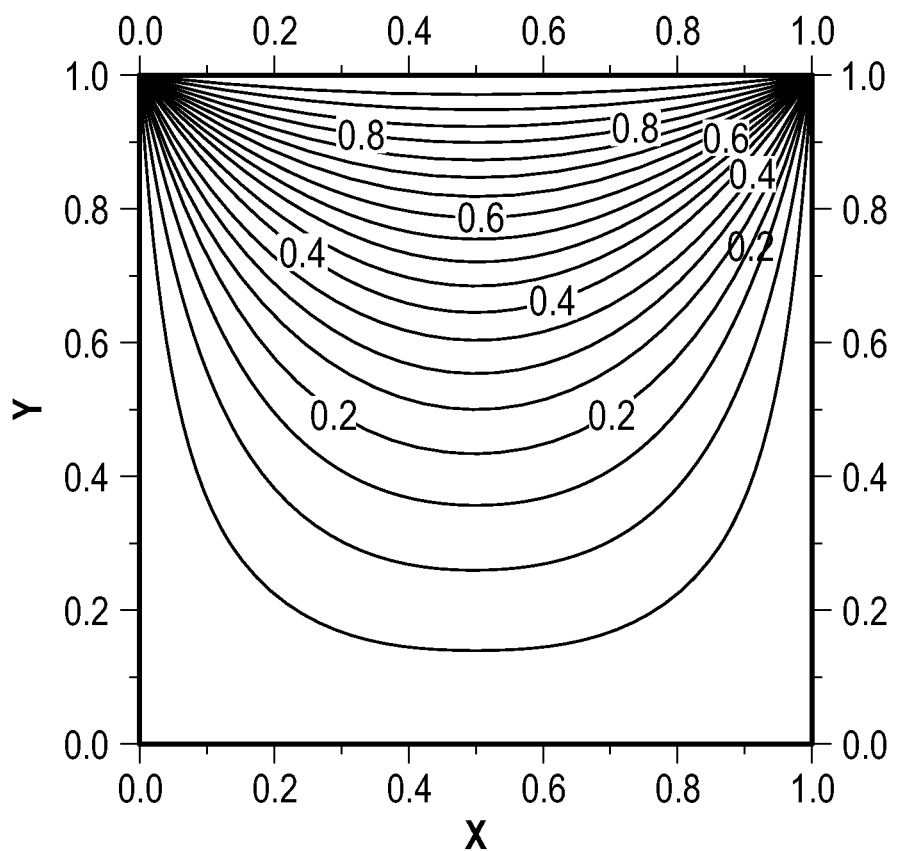
Figure 25B:
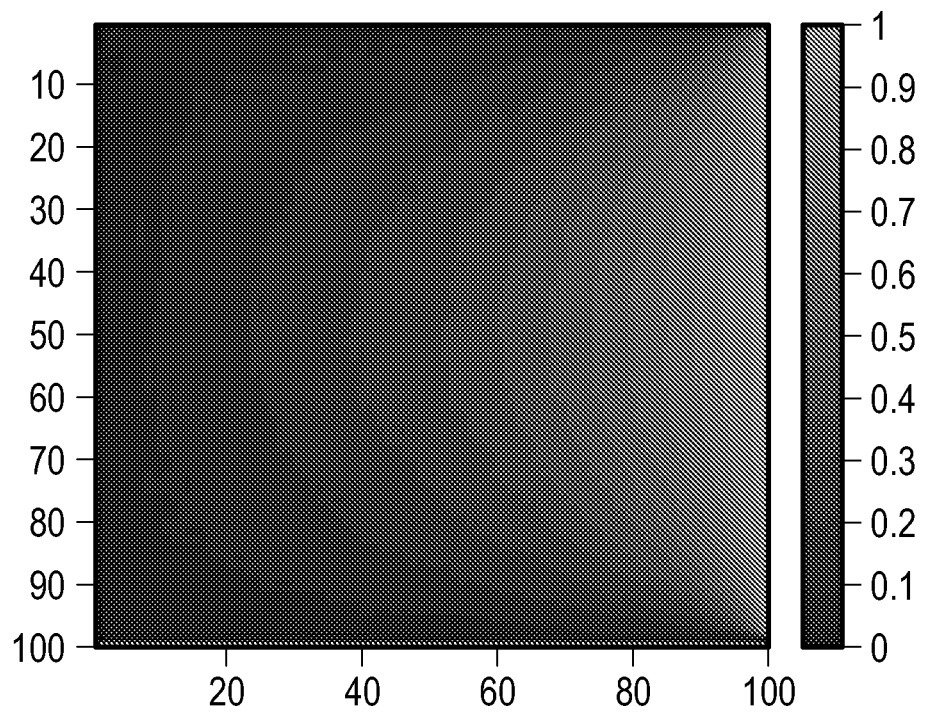

FIGS. 25A and 25B show one exemplary comparison of two visualizations of isotherms calculated by Fourier methods using the separation of variables.

DETAILED DESCRIPTION

The figures and the following description illustrate specific exemplary embodiments disclosed herein. It will thus be appreciated that those skilled in the art will be able to devise various arrangements that, although not explicitly described or shown herein, embody various principles and are included within the scope of the claims. Furthermore, any examples described herein are intended to aid in understanding the principles of the embodiments and are to be construed as being without limitation to such specifically recited examples and conditions. As a result, the embodiments are not limited to the specific examples described below.

The exemplary thermoelectric devices and methods disclosed herein increase performance of a thermoelectric generator by the shaping of the isothermal fields within the bulk of a thermoelectric pellet, resulting in an increase in power output of a thermoelectric generator module. In the following embodiments, it will be computationally shown that there is a distinct advantage in power generation through the presence of a metal layer on the sidewalls of the pellet, and the increase in power output generally depends on the thickness of the metal layer, the fraction of the metal coverage on the sidewall, and the number of sidewalls with metal coverage on the pellet. The presence of the thermally conducting metals on the sidewalls effectively increases the active area of the isotherms for the thermoelectric effect through inducing a three-dimensional curvature of the isotherms.

In one embodiment, a thermoelectric device includes a pellet comprising a semiconductor material, a first metal film surrounding a first portion of the pellet and a second metal film surrounding a second portion of the pellet. The first and second metal films are configured proximate to one another about a perimeter of the pellet. The pellet is exposed at the perimeter and the perimeter is configured at a sidewall height about the pellet to provide a non-linear effect on a power output of the thermoelectric device by modifying an isotherm surface curvature within the pellet. The device also includes a metal container thermally and electrically bonded to the pellet.

Geometric Effects in the Thermoelectric Seebeck Effect

It has been shown analytically that output power of a thermoelectric generator increases as thermoelectric pellet thickness decreases, to a point where the thermal conductance of the semiconductor pellet cannot support a thermal gradient. Naturally, at this point, output power decreases to zero when the pellet thickness approaches zero. The same relationship has been shown computationally, and that result is verified herein as a confirmation of the computational model using an ideal and basic thermocouple pair component model without all the bonding layers included. More specifically, maximum thermoelectric power may be generated for a pellet thickness between about 80-100 microns, depending on the physical properties of the semiconductor. Maximum current may occur at a somewhat lesser value of thickness than the maximum power, while voltage monotonically increases with pellet thickness. Thus, maximum the maximum power point is somewhat greater than the pellet thickness for maximum current.

The studies for a thermocouple pair device herein were verified via the analytical approach and in a computational model. Here, the temperature dependent properties of the package components were used. Ideal conditions were used such as no electrical contact resistance between the thin film metal electrode on the semiconductor and the semiconductors and no contact heat transfer coefficients were used in the modeling. The model includes the temperature dependent properties of relevant packaging materials, such as copper, aluminum, except the solder layer between the TLE and the pellet. The solder layer was not included since the layer is relatively thin and has a much higher thermal conductivity than the pellet. In one embodiment, the modeling included the measured properties of the semiconductors. In one embodiment, measurements were made on semiconductor bars of the sintered semiconductors and data collected for the Seebeck coefficient, electrical, and thermal conductivity as function of temperature.

The computational model used herein shows generally the same maximum power point at about 100 microns, in agreement with previous analytical and computational results. The thermoelectric effect as a function of pellet thickness is shown in FIG. 8. In thermoelectric theory, the power output of a pellet is related to the pellet thickness and the cross-sectional area of the of the pellet.

For the range of thickness where power is maximum for a given material, the pellet is considered a thick film at less than about 100 microns. For the case of hot pressing or cold pressing with thermal processing, some semiconducting materials are brittle and prone to fracture post sintering, like bismuth and antimony tellurides used here. Hence, it may not be practical to use pick and place automated techniques for thermoelectric thick films because of the fragility in handling. In general, thick films should be made by printing, dispensing, or plating methods, unless they are grown as single crystal and diced in wafer form.

In accordance with the results above for the optimum pellet thickness, and the fact that such thermoelectric telluride-based pellets are brittle effect, an alternative method is suggested instead of making the pellet thinner to acquire more electrical power per pellet. This method involves the modification of the thermal gradients within a thicker pellet by use of metal sidewall layers of the pellet. Metal is generally very thermally and electrically conductive compared to thermoelectric semiconductors. These physical properties are a distinct advantage in controlling the isothermal temperature fields within the semiconductor pellet bulk, which in turn increases the effective volume of the thermoelectric effect. It is shown computationally that by injecting heat and electrical energy through the sidewalls of a pellet adjacent to a thick film of metal, thermoelectric power increases in both a linear and a non-linear fashion.

The bonding of metal to the sidewall of a thermoelectric pellet with high thermal conduction, and the modification of the thermal gradients within the pellet, is an alternative method is suggested to effectively increase the active volume of the thermoelectric effect to acquire more electrical power. This method involves the modification of the thermal gradients within the pellet by use of metal sidewall layers that provide thermal focusing. One reason to invoke an increase in the thermoelectric power generation within a given semiconductor volume regards control of the thermal gradients. In particular, the control of the shape of the thermal gradients is one reason to increase the effective volume of thermoelectric effect. By introducing a three-dimensional curvature in the isotherms, it is shown computationally that by injecting heat and electrical current through the sidewalls of the pellet coated with a thick layer of metal, thermoelectric power increases by an increased effective thermoelectric volume with pellet. The curvature of thermal gradients resulting from the thermal lensing (focusing) effect has changed their shape of their isotherms within the internal volume of the pellet.

One method of surface mount technology for assembling metallized thermoelectric semiconductor pellets with the other components in a thermoelectric module depends on the materials, size and thickness of the pellets, and ease of handling. For example, automated techniques in module assembly can result in a cost-effective method with robotic pick and place for high-volume manufacturing. Metallized pellets in the size range of several millimeters on an edge and about 0.5-1.5 mm thick are easily placed in trays where pick and place robots can easily build a thermoelectric module (or cartridge) consisting of hundreds of pellets in a few minutes. Pellets in this size range have a distinct advantage in that they are easily handled and tracked by operators necessary in certain process operations (e.g., where the process is not fully automated).

Some methods of metallization are much more cost effective also, especially if semi-automated techniques are in place to a reasonable extent. Electroplating is one such method, and the thickness of the metal electrode layers are easily controlled within the electroplating or electroless plating process.

The injection of heat from the sidewalls is accomplished by a layer of a relatively high thermally conductive material (s) on the sidewalls such as metal, into a volume of material of low thermal conductivity, such as thermoelectric semiconductors. The ratio of thermal conductivity is important in the thermal injection of heat through the sidewalls of the pellet. A metal such as copper, nickel, or silver can be electroplated to form such a layer. The thicker the sidewall material may result in a higher the thermal conductance with more heat being transferred to the interior of the pellet from the sidewalls in accordance to the conductance. This injection of heat may result in a modification of the shape of the thermal gradient within the pellet. The spatial modification of the thermal gradient may result in changes of the spatial generation of the current provided by the thermoelectric effect, when compared to the planar isotherms generated within of the pellet when using standard electrodes only on the top and bottom of the pellets.

The power generated by the thermoelectric effect may depend directly on the area of the thermal gradient, and this area may be increased without changing the volume of the pellet. The internal volume of the pellet between the top and bottom electrode surfaces may also be utilized through the sidewalls of the pellet. Once heat is injected through the electrodes on the sidewalls and the top and bottom electrodes, the isotherms within the pellet, as defined by the thermal gradients, are generally no longer parallel to the top and bottom surfaces (e.g., two dimensional parallel isotherms) as in the case of no metal on the sidewalls.

The injection of heat into the sidewalls may change the shape of the isotherms to curved surfaces (dome-shaped) within the pellets, having a three-dimensional shape rather than a two-dimensional planar shape, thereby increasing the area of the thermal gradient. Such a change in the shape of the isotherms to 3D surfaces increases the effective area of the thermoelectric effect within the volume of the pellet, thus increasing the thermoelectric power generated. Since there is also charge carrier injection through the sidewalls (e.g., because of the high electrical conductivity of the metal), the thermoelectric current is also increased as it allows the enhanced thermal gradients to drive more charge carriers to the opposite electrode.

Thermoelectric current, and therefore power, generated in the thermoelectric effect is proportional to the effective surface area of the thermal gradient comprised of parallel isotherms. This current is generally proportional to the second spatial derivative of the temperature gradient and is therefore generally parallel to the normal of the thermal gradients throughout the volume of which the thermoelectric effect occurs. At steady state, the equation relating the second spatial derivative of the temperature field is proportional to the Joule heating effect ($\sim I^2$) as follows:

$$\frac{d}{dx}\left(kA\frac{dT}{dx}\right) + \frac{I^2\rho}{A} = 0$$

where I is the thermoelectric current, and the Thomson contribution of the thermoelectric current is neglected with J as they balance to 0

The second derivative of a variable describes its curvature, and the inverse of curvature is the radius. Hence, the thermal lensing electrode effect decreases the radius of curvature of the isotherms within the pellet volume and creates the dome-shaped isotherms, increasing the thermoelectric current and therefore output power. More power can be generated within a pellet volume by this effective increase of the surface area of the isotherms without increasing the size or shape of the pellet. Hence, more heat energy can be converted to electrical power by the directing, or focusing, the heat transport per semiconductor volume. The power output of a thermoelectric module may be increased by as much as about 60% when using a thermally enhanced thermoelectric pellet.

In summary, since the thermoelectric effect depends directly on the area of a thermal gradient, the modification of the thermal gradient within the pellet by a TLE results in increased output power. The power is generally increased by increasing the effective area of the thermoelectric effect internal to the pellet by modifying the isotherms to have a 3D curvature within the pellet. Hence, more isotherm area per semiconductor volume is produced. More current, and therefore power, can be generated within a pellet by increasing the surface area of the isotherms. Since thermoelectric current is proportional to the effective surface area of the isotherms within a pellet, more electrical power can be converted through the enhancement of heat transport.

Computational Analysis and Related Theory

Computational analysis was performed using Comsol multiphysics program which includes a multiphysics thermoelectric module. A scale for the modelling was chosen for convenience in meshing small components and high geometric aspect ratios. For these results, 6×6×1 mm pellet dimensions were chosen, with all other components geometrically automatically scaled to match the dimensions of the pellet without changing the basic configuration of the thermocouple pair. All computations were based on the steady state conditions with no dependence on time. That is, the boundary conditions for each interface is essentially constant in temperature with no time dependence. Because of these stationary boundary conditions, the heat injection on each sidewall can be added in a linear fashion.

In the computational analysis, some metal layers were omitted to make the meshing align easier at interfaces between components and reduce computation time. Alternately, an increase in component thickness to accommodate meshing would be accompanied by an appropriate reduction of physical properties to effectively maintain both thermal and electrical conductance. FIG. 1, for example, does not include the pellet's thin metal films necessary for soldering to the TLE 110, since both have relatively very high thermal and electrical conductivity in comparison to the pellet. In FIG. 1, a square semiconductor pellet 100 is shown inserted in the TLE 110 with four thermally conductive sidewalls 111 starting from the top electrode with a sidewall metallization gap left at the bottom of the pellet of 0.25 mm. The pellet 100 and the TLE 110 may be bonded together with solder to provide a thermally enhanced thermoelectric component (TETC). Also, the convergence of the multiphysics solution is more attainable when avoiding components with high aspect ratios of their thicknesses. The temperature difference from the hot to cold side in most cases was 100° C. The thermally induced stress between the components was ignored because the package is symmetric through the mid-plane of the pellets and serves to stress balance the thermal stresses.

FIG. 2 shows one exemplary TLE component 110 with 1 mm walls 111 for the pellet 100. The TLE component 110 is a subcomponent of a TETC for attaching the pellet 100 with a solder layer within the TLE 100. The analysis did not extend beyond this thickness. In one embodiment, the thermal lensing electrode shown in FIG. 2 is copper or nickel, where varying metal thickness and height of this component were used to establish the nature of the thermal lensing effect.

In FIG. 3, the square semiconductor pellet 100 is shown within the four thermally conductive sidewalls 111 of the TLE component 110. In one embodiment, the pellet 110 starts from the top electrode with a metal gap 114 left at the bottom of the pellet of 0.25 mm. The semiconductor pellet 100 is illustrated with a beveled geometry 112 to electrically isolate the top and bottom electrodes.

The component of FIG. 3 was exemplarily integrated into the geometric construction in Comsol for a thermocouple pair with all interfaces ideal, that is, no electrical or thermal barriers, as these vary widely in the industry depending on materials used in the assembly of thermoelectric devices. Hence, ideal devices were used to formulate the results with the expectation that lower performance can be expected for non-ideal conditions, and non-ideal results can easily be included by methods explained above. In addition, the models used the temperature dependent materials, either measured (semiconductors), or included in the materials library of Comsol.

FIG. 4 shows one exemplary computational geometry for a single thermocouple pair device 120 comprising of square two semiconductor pellets, N and P pellets with four copper sidewalls as the thermocouple pair. In this embodiment, a sideview of the thermocouple pair device 120 is illustrated with two square semiconductor pellets having four copper sidewalls each starting at the bottom electrode interconnect on each pellet. The sidewalls have a 1 mm in thickness and a metal gap of 0.15 mm at the top electrode interconnect.

The copper metal resistive load is shown above the pellets, which is modified parametrically in resistivity to simulate a varying load to generate load lines. The load lines are shown in FIG. 18 and FIG. 20 with other parameters, with metal sidewall thickness and temperature difference between the hot and cold side respectively. As expected, these are linear relationships.

FIG. 5 is an isometric view of one exemplary single thermocouple pair device 120 with four copper sidewalls 0.65 mm in height and 0.2 mm in thickness, starting from the top electrodes of each pellet, and a metal gap of 0.35 mm at the bottom electrode.

FIG. 6 illustrates another view of the thermocouple pair device 120 with two pellets 100. FIG. 6 exemplarily shows from the bottom component to the top component: an anodized aluminum substrate, a copper interconnect, an N-type and a P-type pellet, and 1 mm thick copper sidewalls on three sides of each pellet (transparent rendering) for heat and current injection. Thicker sidewall metal thickness results in higher thermal and electrical conductance, as shown in FIG. 18, where the 1 mm sidewall thickness has the highest power output. In addition, a higher fraction of sidewall coverage results in a higher output, as shown in comparing the case for the 0.05 mm at 0.85 and 0.65 fractional coverage, and observed in FIG. 10 for the case of 0.2 mm thick sidewalls of nickel with the fraction of metal sidewall coverage as a parameter.

FIG. 7 is one exemplary computational mesh 140 in a thermocouple pair circuit for the case of sidewalls with a gap at the top of the sidewall. The limitations for meshing are determined by the thickness aspect ratio of adjacent components. As discussed earlier, a means to compensate for these limitations exists by adjusting the thicknesses and physical properties of the materials.

FIG. 8 shows one exemplary relationship 150 between device power of a thermocouple pair circuit and pellet thickness normalized to the power output of a 1 mm thick pellet device. Computations have been derived to provide an analytical solution for a thermocouple pair. These computations herein confirm those results and provide a motivation for increased power output though an alternative method, namely the inclusion of sidewall metal coverage in the packaging of a thermoelectric module.

FIG. 9 shows an exemplary normalized maximum power output 160 with respect to a 1 mm thick pellet with no metal sidewalls vs. the number of sidewalls covered with metal. That is, FIG. 9 shows the normalized linear maximum power output with respect to a pellet with no metal sidewalls for a 1 mm thick pellet vs. the fraction of nickel metal sidewall coverage in this embodiment, the metal coverage for each sidewall used is 0.8 mm (80%). The relationship is linear ($R^2=1$) for power output versus the number of sidewalls present on the pellet. This relationship agrees with the analytical results with similar boundary conditions in a 2D rectangle for solutions of the stationary heat equation. In the analytical cases, homogeneous (or non-mixed boundary) conditions are used. Every sidewall can be treated independently of one another because this is a case of stationary heat transfer, and heat injection is linearly added. Thus, the power generated through the thermoelectric effect is additive for each sidewall, thereby resulting in a linear relationship for output power versus the number of sidewall present on the pellet. It is of interest to note that the computational model results agree with the analytical results, even though the boundary conditions in the model are inhomogeneous, as there is a gap in the sidewall metal to avoid shorting between the top and the bottom of the pellet electrodes. This implies that the analytical solution for the temperature field can be solved by separating out solutions for each sidewall, as well as each portion of a sidewalls not coated with metal. These results are summarized in FIGS. 25A and 25B, where the isotherms from analytical results agree with isotherms from the computational results of FIG. 13. Note the similarity of the analytical and computational results, confirming that the curvature of isotherms. The curvature of the isotherms increases the area of the thermoelectric effect, and therefore power output in a linear fashion for the number of sidewalls present.

FIG. 10 illustrates one exemplary maximum device power output 170 normalized to the maximum power for a pellet with no metal sidewalls vs. the fraction of nickel metal sidewall coverage for a 1 mm thick pellet. FIG. 10 shows the exemplary maximum power output of the thermocouple pair with sidewall metal coverage normalized to the maximum power output of the case for no sidewall, with the fraction of sidewall metal coverage as the parameter. The metal thickness is 0.2 mm in this case. This nonlinear behavior shows that the thermal lensing effect is nonlinear with respect to the fraction of sidewall coverage, something not shown previously, as the thermoelectric effect was not used by previous analytical solutions for solutions of temperature fields. Solutions for the case of inhomogeneous boundary conditions are known. Note that the polynomial used to describe the nonlinear behavior is to the $6^{th}$ power of the fraction of sidewall coverage with an $R^2$ of 1.

FIG. 11 shows one exemplary cross section of the thermal gradient 180 through the center of a pellet for sidewall metal causing thermal lensing for the case of sidewall thickness of 0.05 mm aperture centered at 0.5 mm of the pellet height. Thermal lensing is present symmetrically in both the upper and lower halves of the pellet and create dome-shaped isotherms, which in turn increase the active area for the thermoelectric effect.

FIG. 12 shows one exemplary cross section of the thermal gradient 190 of 100° C. through the center of a pellet for the case of no sidewall metal, resulting in planar isotherms.

FIG. 13 shows exemplary thermal focusing 200 for the case of an 0.2 mm wide aperture located at the top of the pellet for a sidewall thickness of 1 mm. Note that the thermal lensing effect is very strong near the edges.

FIG. 14 shows exemplary thermal focusing 210 for the case of an 0.05 mm wide aperture located at the bottom of the pellet for a nickel thickness of 0.2 mm. The isotherm curvature is opposite that of FIG. 13, showing the isotherm curvature is essentially independent of whether the metal gap appears is located at the hot side or cold side of the pellet.

FIGS. 15A and 15B show exemplary advantages of metal gap location. For example, FIG. 15A compares the resistive load loss 220 of a thermoelectric pair as a function of the center of the 0.05 mm wide aperture on all four of the pellet sidewalls. FIG. 15B illustrates the thermoelectric power output 222. Pellet sidewalls in this embodiment are nickel metal at 0.2 mm thickness. Thermocouple device power output is a function of the position center of the 0.05 mm wide metal aperture on all four sidewalls. Note the maximum power occurs when aperture is located near either the top or bottom of the pellets, indicating the thermal lensing effect is strongest when the metal gap is off-center with respect to the pellet height. Generally, load loss of a thermocouple as a function of the center of the 0.05 mm wide aperture on all four of the pellet sidewalls.

FIG. 15A also shows the variation in actual power output as the center of the 0.05 mm wide gap is varied in position on the sidewall on all four of the pellet sidewalls. When the metal gap is located close to either the bottom or top electrode, the power output is increased with respect to other positions of the gap. Note the maximum power occurs when aperture is located near either the top or bottom of the pellets, indicating the thermal lensing effect is strongest when the metal gap is off-center with respect to the pellet height. The resistive power loads, which are positive, are the opposite of the power produced, which is negative because power generation is considered opposite of power loss. The curvature of the temperature isotherms is greater for these locations and is quite symmetric in terms of performance at either location. The smaller the gap generally results in higher heat and current injection, resulting in higher power output. Apparently, the computational limit of the gap width is determined by the meshing, and physically determined by the practical nature of manufacturing the gap on the side of the pellet, most likely by laser ablation of the thin film of metal on the pellet prior to bonding the TLE.

FIG. 16 shows one exemplary maximum device power output vs. external resistive load factor 230 with fraction of nickel metal sidewall coverage as a parameter. The peaks of each curve are where the resistive load matches the internal resistance of the thermocouple device, where the device includes pellets and electrical interconnects as part of the internal resistance. The straight line 232 through the peaks implies an inverse linear relationship between the maximum device power output versus the external resistive load factor, because the internal device resistance is decreasing with increased coverage of the sidewalls. Since maximum power occurs when there is load matching to the internal resistance of the pellets, a decrease in internal device resistance requires the external matching to also decrease.

FIG. 17 shows one exemplary parametric relationship 240 between normalized maximum power output of a thermocouple pair versus the fraction of metal sidewall coverage with metal thickness as a parameter. The copper metal sidewall coverage is on all four sidewalls of each pellet of a thermocouple pair with metal sidewall thickness as a parameter ranging from 0.05 to 0.2 mm thickness. At 0.20 mm thickness, the thermal lensing effect is strongest. The increase in metal coverage and thickness is accompanied by an increase in thermal conductance through the metal sidewall layer, and therefore an increase in heat injection, which in turn increases the thermal focusing. Hence, an increase in either the fraction of metal coverage or metal thickness increases the device power output.

FIG. 18 shows exemplary current-voltage load lines 250 of three thermocouple pair devices 251, 252, and 253 with metal sidewall coverage on all four sidewalls for metal sidewall thicknesses of 0.05 mm and 1 mm and sidewall coverage at 0.65 and 0.85 fraction of the pellet height. The 1 mm thick sidewall is expected to generate more power because of increased thermal conductance compared to 0.05 mm thick sidewalls. The comparison between the 0.05 mm and 0.85 fraction at 0.05 mm load lines reveal there is a crossover point at higher voltages because the increased metal coverage of the 0.85 mm case reduces the open circuit voltage through partial shorting of the device along the sidewalls. However, at higher currents, thermal focusing effects result in more short circuit current while maximum power (which occurs at ½ the short circuit current and ½ the open circuit voltage) is slightly greater for the 0.85 case than the 0.65 case. These two load lines indicate the sensitivity of maximum power to metal coverage.

FIG. 19 illustrates one exemplary power-voltage relationship 260 of the three thermocouple pair devices 251, 252, and 253 in FIG. 18 with metal sidewall coverage on all four sidewalls for metal sidewall thicknesses of 0.05 and 1 mm and sidewall coverage at 0.65 and 0.85 fraction of the pellet height. Device power vs. resistive load with metal sidewall coverage is one parameter. The peaks are where the resistive load matches the internal resistance of the thermocouple device. The output power indicates that the 0.85 coverage is greater than the 0.5 coverage, and the crossover is at 0.25 volts.

FIG. 20 shows exemplary current-voltage load lines 270 for four temperatures (50° C., 100° C., 150° C., 200° C.) for the case of three sidewalls at 1 mm thickness. The trends are expected and further confirm the computational modelling.

FIG. 21 shows one exemplary semiconductor pellet subcomponent 280 of the TETC. For example, FIG. 21 shows one exemplary thin metallized (253) pellet ready for bonding with a TLE component. The four features are a thermoelectric semiconductor pellet 281, primary metal layer 282 for adhesion and or a diffusion barrier (titanium, tungsten, Ni—P [20], chrome, active brazing alloys, etc.), a layer of metal 283 that is solderable and not prone to oxidize (gold, palladium, and Ni—P), and a gap 284 (e.g., a discontinuity) in the metal layer 283 from the metal 282 surface to the semiconductor material of the pellet 281. Any number of thin film metal layers may be used in accordance with a final layer providing a solderable surface, such as gold, silver, Ni—P, etc. Generally, the metal gap 284 is to break the electrical continuity on the pellet sidewall from the top electrode to the bottom electrode.

FIG. 22 shows one exemplary completed TETC component 290 with details of the layers. The features include the N or P type semiconductor pellet 281, the material removed through the multi-layer deposits to create the gap 284 (i.e., the discontinuity) in the metal surface 282/283 through to the semiconductor surface of the pellet 281, a bonding material 291 such as solder (Sn—Ag—Cu, In—Ag[21], In—Sn) that thermally and electrically bonds the outside surface of the pellet 281 to the inside surface of the subcomponent TLE 292 except where the discontinuous metal gap 284 is placed. Features 282 and 283 are the thin films discussed in FIG. 21, though any number of thin film layers can be used that satisfy the requirements can be used.

FIG. 23 shows one exemplary detailed cross-section of two TETC components mounted in a thermoelectric module 300 as an example of an application. In this packaging option, there are two separate metal interconnects (submounts) are joined with a solder layer 291, which also serves to bond the pellets 281 to the substrates 304. The upper metal substrate has square through holes to provide thermal lensing for the metallized semiconductor pellets layer.

FIG. 24 shows one exemplary detailed cross-section of two TETC components mounted in a thermoelectric module 300 as an example of an application. This packaging option uses a stamped metal substrate to provide thermal lensing for the pellets 281.

FIGS. 25A and 25B shows one exemplary comparison of two visualizations of isotherms calculated by Fourier methods using the separation of variables and are identical to the isotherms determined by computational methods herein.

Fabrication Aspects of a Thermally Enhanced Thermoelectric Component (TETC)

Presented herein is a method to increase thermoelectric generator device output power by a significant factor by modifying the electrode geometry of a semiconductor pellet component used in the assembly of a thermoelectric module. It proposed that the metal sidewalls are formed by a separate fabrication step as a sub-component and then joined with a pre-metallized semiconductor pellet through solder bonding. These two joined sub-components together form a new electronic component for high speed packaging surface mount technology. This method does not apply to the refrigeration mode of the thermoelectric module since the Peltier effect and the Seebeck effect are opposing (bucking) currents. The effect of a thermal lensing electrode for the Peltier mode of operation results in a slight decrease in the coefficient of performance in the refrigeration mode.

In the case of using a metal on the sidewalls, the sidewalls have an aperture, or gap 284, that breaks the electrical continuity between the top and bottom electrodes of the pellet 281 to prevent electrical shorting. Such an aperture can be made by laser ablation along the sidewalls after thin film metallization of the pellet 281. The aperture width can be as narrow as 50 microns or less, or to a practical limit. When using a small aperture on the sidewall metals, there can be two focusing effects depending on the location of the aperture. A narrow aperture located around the pellet at the center of the sidewalls and in parallel to the top surface, produces two thermal focusing effects, one near the top side and one near the bottom side of the pellet. The center of the aperture located near the top or bottom of the pellet results in higher power output than the other locations for the aperture.

A break in electrical continuity of the sidewall can also be accomplished by beveling the four edges of either the top or bottom of the pellet The fabrication of the thermally enhanced pellet (TEP) generally comprises (1) a lensing electrode (TLE) component, (2) a metallized pellet (281, 282, 283) with a break (i.e., the gap 284) in electrical continuity on all the sidewalls, and/or (3) a solder for bonding the TLE and the pellet. The fabrication may be accomplished in a practical sense by a two-step process. First, solderable surfaces on each subcomponent may be used to form a bond joined by solder. Thin film methods such as electroplating or electroless plating can be used to coat the pellet with various metals to form an adhesion layer, a diffusion barrier, and a solderable layer in a variety of methods. The final metal layer generally has a solderable metal to bond to the TLE, which is preferably made of copper, nickel, silver, or any metal with a finish that is solderable. An appropriate amount of the solder is dispensed into the TLE or a fluxless preform of appropriate thickness is inserted into the bottom of the TLE, and then the pellet is placed within the TLE. The two are bonded together after reflow of the solder at the bottom and sidewalls of the pellet 281. It is preferable to use a solder that melts at a higher temperature than the solder used to join the remainder of the package components. In this manner, an electronic component is fabricated for assembly, where high speed pick and place methods can be used.

It is shown that for a single thermocouple pair in power generation mode, an increase in power output is achieved for the device by thermal and electrical injection on the sidewalls of the pellets. The cases may be examined where (1) the effect of adding metallized sidewalls of the same thickness incrementally until the sidewalls have metal with the same thickness (linear dependence with the number of sidewalls, (2) the sidewall height is varied from 0 height to about 0.95 of pellet thickness (non-linear effect with increasing with metal sidewall height), and/or (3) varying the position of a 0.050 mm gap in the sidewall metal. Each variation has unique effects in increasing device power output through thermal focusing. Indeed, it is shown that, contrary to the usual practice in fabrication methods for thermoelectric power generation devices (e.g., where there is an expectation of partial electrical shorting along the sidewall resulting in a reduction of device power output), there is an advantage to partially metallize the sidewalls of a semiconductor pellet. By leaving a narrow gap, or slit, in the metallization of all sidewalls between the top and bottom metal electrode to avoid electrical shorting. This may result in significantly increased thermoelectric power generation through thermal focusing, or lensing. Results may also be presented based on computational analysis for a metallization gap width thickness of 50 microns and a uniform metallization thicknesses of 0.05-1 mm on all four sidewalls (e.g., bismuth-selenium-telluride and antimony-bismuth-telluride thermoelectric pellets) with measured physical properties. The gap 284 that breaks electrical continuity is positioned symmetrically around the pellet 281.

One method to increase output power of a thermoelectric generator by a significant factor includes modifying the electrode geometry next adjacent to the semiconductor pellet 281 used in the component assembly of a thermoelectric module. A new component is suggested that is used in the surface mount component assembly of a thermoelectric module. An increase in power output is achieved by thermal and electrical injection into the bulk of the semiconductor pellet through the sidewalls of the pellet 281. Indeed, contrary to the usual fabrication methods, there is an advantage to partially metallize the sidewalls of a semiconductor pellet 281. Furthermore, leaving a small gap 284, or slit, in the metallization of the sidewalls between the top and bottom metal electrode results in significantly increased thermoelectric power generation through a thermal lensing electrode. Results are presented based on computational analysis for a metallization gap width of 50 microns on all four sidewalls of a telluride-based thermoelectric pellet, positioned symmetrically.

FIG. 21 shows one exemplary cross-section view of the pellet 281 sub-component for the TETC. Typically, the pellet can be electroplated or electroless plated methods, as these methods can easily be performed in large volume on modern plating companies. Several layers (e.g., layers 282 and 283) can be sequentially plated to satisfy adhesion, diffusion barriers, and a solderable layer to join to other components. The number of layers can typically be 3 to 4 layers as needed as described in the previous section. Methods for depositing these layers are physical vapor deposition, explosive lamination, electroplating, electroless plating, high compression lamination or pressing. Once the metal layers have been deposited on both the N type and the P type pellets, a gap 284 in the metal layers is created on all four the sidewalls of the semiconductor pellet 281 to break the electrical continuity down the sidewall of the pellet. This operation can include grinders, specialty saws, lasers, abrasive wires, or EDM techniques. The removal of the sidewall metal in the appropriate height along the pellet sidewall is important as discussed above, and the gap 284 is continuous along all sidewalls and preferably at the same height on all four sidewalls.

FIG. 22 shows, as discussed above, one exemplary completed TETC component with details of the layers and using the same aspects of the semiconductor pellet as just described in FIG. 21. The method of fabrication of the metal TLE 292 (e.g., shaped like a square metal cup) can be embodied by a variety of techniques. Techniques such as stamping, forming, electroforming, stenciling, molding, and casting can be used. The TLE is attached to the N pellet and the P pellet by means of conventional or special solders as noted in the previous section that reflow at distinct temperature that is different than that of the solder that is attaching the TLE to the metal substrate (electrical interconnect). The difference in reflow temperature is generally required to allow multi-stage assembly. Solder candidates include a transient liquid phase alloys. These alloys contain pure metal that melt at low temperatures (In, Sn), and a metal that melts at higher temperatures (Ag, Cu). Once melting begins, an intermediate is formed in the process and freezing of the solder begins. Once the intermediate compound is formed, the next melting is relatively high (650° C. for the case of In—Ag). Thus, more conventional alloys such as Sn—Ag—Cu (SAC) can be used for the remainder of the assembly to join components. For these types of in-situ alloys, one embodiment includes the use of Ag—Sn to keep material costs low. In addition, more conventional solders can be used, preferably lead-free solder alloys.

In FIG. 22, the N or P type semiconductor pellet sub-component has material 283/284 removed through the multi-layer deposits to create a discontinuity in the metal surface through to the semiconductor surface. The solder layer 291 discussed above (Sn—Ag—Cu, In—Ag[21], In—Sn, Ag—Sn) that is applied to bond the metallized pellet and the TLE 292 that surrounds the pellet surface on all four sidewalls (e.g., up to the height of the discontinuous metal gap or slightly less) and a bonding material that thermally and electrically bonded to the outside surface of the pellet and the inside surface of the TLE sub-component. The metal layers 282/283 are again shown with in the TLE 292, except where the discontinuous metal gap 284 is placed. In this embodiment, the metal layers 282/283 are thin films discussed in FIG. 21, though any number of thin film layers can be used that satisfy the requirements can be used.

FIG. 23 shows a cross-section of one type of application of the TETC 300 utilizing a two-piece assembly (i.e., a TETC-2L) where both substrates are matched in lateral dimensions in order to fit one on top of the other with matched substrate perimeters. In other words, the substrates are generally identical parts and when stacked vertically, and the two substrates are intended to a single unit for the TETC component placement. The bottom substrate 304 is solid, whereas the top substrate 306 has two square apertures through the thickness of the substrate (thru-holes). The square holes in the top substrate can fabricated through processes such as laser cutting, stamping, casting, molding, machining, and manual cutting. These square apertures provide the heat for thermal lensing for the N and P pellets 281 after being bonded to the substrates by solder 291. The previous features as described in FIGS. 21 and 22 have been modified to provide a double TLE component that provides thermal lensing for two semiconductor pellets 281. A lower piece 304 of the two-piece TLE supports the upper portion of the TLE component. Thus, with components 306, the modified substrate has a double thermal lensing electrode component with two substrate layers, or TETC-2L FIG. 24 shows yet another method to apply thermal lensing for the pellets 281. As in the case for TECT-2L, the TLE sub-component is modified to include two pellets 281. For this packaging option, the TLE is modified in the same manner as for the TLEC-2L through processes such as laser cutting, stamping, casting, molding, machining, and manual cutting. As in FIG. 23, the previous features as described in FIGS. 21 and 22 are used in FIG. 24. In FIG. 24, portions of feature 306 and 304 have been modified to provide a double TLE component that provides thermal lensing for two semiconductor pellets using one metal substrate. Hence, in this component this modified substrate is a double thermal lensing electrode component with one substrate layers, or TETC-1L.

In any or all of the above examples, the metal sub-components of the TETC have relatively high thermal and electrical conductivities (e.g., copper plated with nickel).

FIG. 23 shows several exemplary features that may be used in manufacturing. For example, in one embodiment, the pellet 281 is a thermoelectric semiconductor component that has been metallized with multiple layers that include feature 282, diffusion barrier, and layer 283 (e.g., a noble metal on top of the pellet 281 base material to prevent oxidation). The manufacturing methods used to make such a multilayer deposit on the pellet can include physical vapor deposition (PVD), explosive lamination, sputtering, electroplating, electroless plating, and high temperature lamination.

Gap 284 comprises a slit where metal removal has taken place to create a thermal and electrical break in the pellet's perimeter edge to avoid shorting. This break provides the thermal lensing effect to improve power output. Some manufacturing methods used to create the feature in the gap 284 include wire electrical discharge machining (EDM), abrasive wire cutting, metallization process masking, abrasive saw cutting, and laser etching. The metalized pellet 281 may then be placed into a two-piece thermal lensing device made of solid component 304 and a twin cavity implemented by components 306. The components 304 and 306 may be manufactured by means of stamping, 3D printing, laser cutting, waterjet cutting, wire EDM, CNC machining, or casting. The components 304 and 306 can also be fabricated in one piece by means of 3D printing, stamping, and CNC machining. The components 304 and 306 may include copper and electroplated with nickel to prevent oxidation. The cavities in component 306 generally match the shape of the pellet 281 (e.g., slightly larger than the pellets 281 to provide space for the bond material 291). The component 304 may include cavities that are attached to the solid piece component 306 by means of thermal soldering, ultra-sonic soldering, explosive lamination, high temperature pressing, and thermally and electrically compliant adhesives. The components 304 and 306 thus become a one-piece component with two cavities such that completed metallized pellets 281 with gaps 284 may be placed and attached to the components 304 and 306 through a curing process specific to the method of adhesion of the solder bonding material.

The inside square cavities formed by the apertures in component 306 may be coated in solder (e.g., by means of dispensing, stencil printing, and mask-spraying) such that pellet 281 (and layers 282 and 283) may be attached thereto. Any or all of the components may be placed into tape and reel, vibratory bowls, tubes, or Joint Electron Device Engineering Council (JEDEC) trays to utilize high speed placement by robotic systems. An appropriate thermal adhesive may be printed using stencils for retaining the components 304 and 306 during high speed robotic pick and place. This process may be repeated many times to populate a package board and build a large-sized industrial module or cartridge. The P-type and N-type pellets 281 may then be placed into these cavities where the sidewall height of the component 306 matches the height of the gap 284 slit utilizing high speed robotic systems. The thermal lensing assembly 300 may be repeated many times on a module package board (e.g., a copper-clad alumina, anodized aluminum, or other suitable flat substrate) such that elements of the bottom half of the cartridge (or module) surround the pellet 281. A top board with mounted metal interconnects (e.g., layer 304) may be positioned and bonded in appropriate positions and number to complete a series circuit between the components on the bottom board. Solder may be printed onto the top of the pellets 281 on the bottom board to bond to the package boards together. This clamshell like assembly may then be mounted in an aluminum retainer that places a slight pressure on the assembled module. The assembly may then be thermally processed by means of a batch oven, conveyorized reflow oven, ultraviolet (UV) curing, and/or ultra-sonic welding systems) to complete the process of curing the materials and reflowing the solder.

What is claimed is:

1. A thermoelectric device, comprising:
 a semiconductor pellet having a top surface, a bottom surface, and a sidewall extending between the top and bottom surfaces;
 a first metal layer covering the top surface, the bottom surface, and the sidewall of the semiconductor pellet except for a gap that exposes a portion of the sidewall of the semiconductor pellet; wherein the center of the gap is located at a distance less than 20% of the height of the semiconductor pellet from the top or bottom surface
 a second metal layer covering the first metal layer; and
 a metal container thermally and electrically bonded to the second metal layer via solder, wherein the gap is configured about a perimeter of the semiconductor pellet off-center with respect to a height of the semiconductor pellet, wherein the first and second metal layers remain at a sidewall of the semiconductor pellet above and below the gap.

2. The thermoelectric device of claim 1, wherein:
 the gap is configured at a sidewall height that provides a non-linear effect on a power output of the thermoelectric device by modifying an isotherm surface curvature within the semiconductor pellet.

3. The thermoelectric device of claim 2, wherein:
 the isotherm surface curvature within the semiconductor pellet is operable to increase an effective surface area of a thermoelectric effect within a volume of the semiconductor pellet via heat injection through the sidewall of the semiconductor pellet.

4. The thermoelectric device of claim 1, wherein:
the metal container surrounds the second metal layer proximate to the gap.

5. The thermoelectric device of claim 1, wherein:
the metal container provides a thermal lensing electrode structure.

6. The thermoelectric device of claim 1, wherein:
the first metal layer and the semiconductor pellet comprise beveled edges proximate to the perimeter of the semiconductor pellet to electrically isolate the first and second metal layers from one another.

7. The thermoelectric device of claim 1, wherein:
the first and second metal layers comprise a higher thermal conductivity than the semiconductor pellet.

8. The thermoelectric device of claim 1, wherein:
the semiconductor pellet is configured in a shape that is operable to increase a thermal lensing effect of the thermoelectric device.

9. The thermoelectric device of claim 1, wherein:
the shape is cuboid.

10. The thermoelectric device of claim 1, wherein:
the shape is cylindrical.

11. The thermoelectric device of claim 1, wherein:
the first and the second metal layers are electrically isolated from one another.

12. The thermoelectric device of claim 1, wherein:
the first metal layer comprises copper, titanium, tungsten, nickel-phosphorous, or a chromium alloy.

13. The thermoelectric device of claim 1, wherein:
the second metal layer comprises copper, nickel, silver, gold, palladium, or nickel-phosphorous.

* * * * *